(12) United States Patent
Huang et al.

(10) Patent No.: US 10,991,739 B2
(45) Date of Patent: *Apr. 27, 2021

(54) NARROW BAND FILTER WITH HIGH TRANSMISSION

(71) Applicant: Taiwan Semiconductor Manufacturing Co., Ltd., Hsin-Chu (TW)

(72) Inventors: Cheng Yu Huang, Hsinchu (TW); Chun-Hao Chuang, Hsinchu (TW); Chien-Hsien Tseng, Hsinchu (TW); Kazuaki Hashimoto, Zhubei (TW); Keng-Yu Chou, Kaohsiung (TW); Wei-Chieh Chiang, Yuanlin Township (TW); Wen-Hau Wu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/837,312

(22) Filed: Apr. 1, 2020

(65) Prior Publication Data
US 2020/0227460 A1 Jul. 16, 2020

Related U.S. Application Data

(63) Continuation of application No. 16/156,061, filed on Oct. 10, 2018, now Pat. No. 10,651,220.
(Continued)

(51) Int. Cl.
*H01L 27/146* (2006.01)

(52) U.S. Cl.
CPC .. *H01L 27/14629* (2013.01); *H01L 27/14621* (2013.01); *H01L 27/14685* (2013.01)

(58) Field of Classification Search
CPC ......... H01L 31/02327; H01L 27/14629; H01L 31/02162; H01L 31/02165
See application file for complete search history.

(56) References Cited

U.S. PATENT DOCUMENTS 10,651,220 B2 * 5/2020 Huang .............. H01L 27/14629
2010/0243868 A1 9/2010 Liu et al.
(Continued)

OTHER PUBLICATIONS

Bandyopadhyay, R. "Design of multistack Fabry-Perot structure with Defect as tunable transmission Filter for CWDM using FDTD method" Int. conf. on Opt. and Pho. Proc. of SPIE 2015 vol. 9654 Jun. 14, 2015 pp. 1-4 (Year: 2015).*

(Continued)

*Primary Examiner* — Grant S Withers
(74) *Attorney, Agent, or Firm* — Eschweiler & Potashnik, LLC

(57) ABSTRACT

Various embodiments of the present application are directed to a narrow band filter with high transmission and an image sensor comprising the narrow band filter. In some embodiments, the filter comprises a first distributed Bragg reflector (DBR), a second DBR, a defect layer between the first and second DBRs, and a plurality of columnar structures. The columnar structures extend through the defect layer and have a refractive index different than a refractive index of the defect layer. The first and second DBRs define a low transmission band, and the defect layer defines a high transmission band dividing the low transmission band. The columnar structures shift the high transmission band towards lower or higher wavelengths depending upon a refractive index of the columnar structures and a fill factor of the columnar structures.

20 Claims, 30 Drawing Sheets

Related U.S. Application Data

(60) Provisional application No. 62/711,772, filed on Jul. 30, 2018.

(56) References Cited

U.S. PATENT DOCUMENTS

| | | |
|---|---|---|
| 2019/0016091 A1 | 1/2019 | Lee et al. |
| 2019/0244993 A1* | 8/2019 | Yamaguchi ............ H04N 5/369 |
| 2019/0305016 A1 | 10/2019 | Tsang et al. |

OTHER PUBLICATIONS

Mabrouk, M. "Bragg Grating and Fabry-Perot Filters in Data Transmission by Laser Beams" Master's Thesis Jul. 2009 pp. 1-90 (Year: 2009).*

Notice of Allowance dated Dec. 27, 2019 for U.S. Appl. No. 16/156,061.

* cited by examiner

NARROW BAND FILTER WITH HIGH TRANSMISSION

REFERENCE TO RELATED APPLICATIONS

This application is Continuation of U.S. application Ser. No. 16/156,061, filed on Oct. 10, 2018, which claims the benefit of U.S. Provisional Application No. 62/711,772, filed on Jul. 30, 2018. The contents of the above-referenced applications are hereby incorporated by reference in their entirety.

BACKGROUND

Many devices include photodetectors to sense incident radiation. For example, a complementary metal-oxide-semiconductor (CMOS) image sensor may comprise an array of photodetectors to convert an optical image to digital data representing the optical image. However, photodetectors typically have little to no ability to discriminate between different wavelengths (or colors) of radiation. Therefore, filters may be paired with photodetectors to allow the photodetectors to sense specific wavelengths of radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
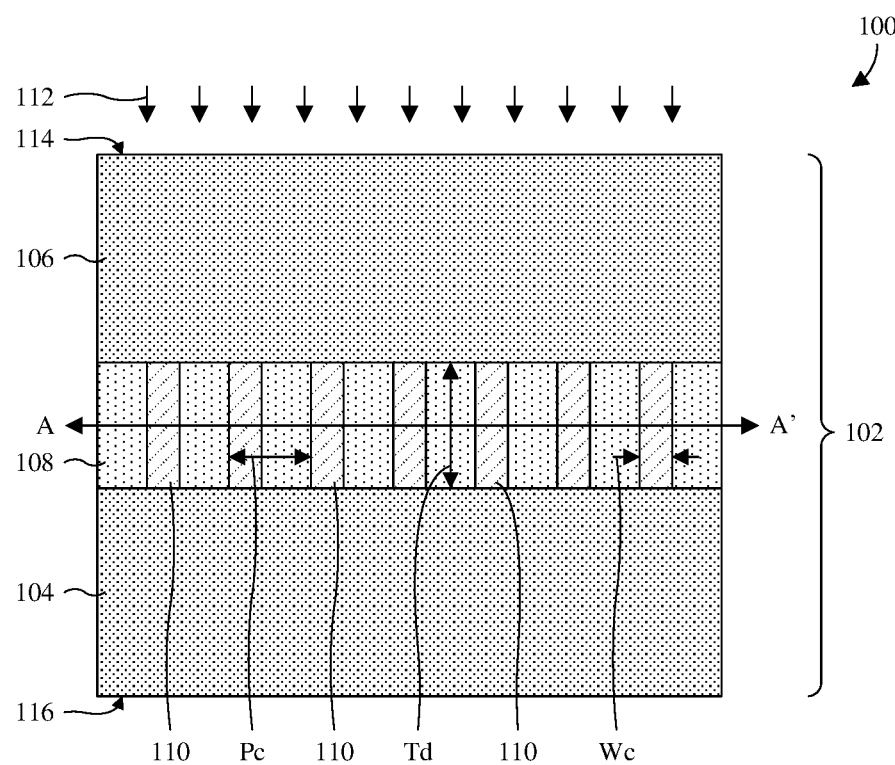
FIG. 1 illustrates a cross-sectional view of some embodiments of a narrow band filter with a periodic arrangement of columnar structures localized to a defect layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One type of wavelength filter is an absorptive filter. An absorptive filter is a filter made of a material that absorbs some wavelengths of radiation while transmitting other wavelengths of radiation. An absorptive filter is limited by the available materials, such that it can be difficult to control properties of the absorptive filter. For example, it can be difficult to achieve a narrow transmission band. A narrow transmission band may, for example, be a transmission band with a width less than about 50 nanometers.

Another type of wavelength filter is a microcavity filter. A microcavity comprises a pair of metal plates and a thin film sandwiched between the metal plates. The thin film defines a microcavity within which constructive interface occurs for wavelengths in the transmission band and within which destructive interface occurs for wavelengths outside the transmission band. However, despite constructive interface for wavelengths inside the transmission band, the microcavity filter has poor transmission due to absorption by the metal plates. Further, the transmission band of the microcavity filter is shifted by varying a thickness of the thin film. However, multiple wavelength filters with different transmission bands are often used together in image sensors and other devices. This leads to many masks to set thicknesses of the various wavelength filters, and further leads to high costs since masks are expensive.

Yet another type of wavelength filter is a plasmonic filter employing a metal nanostructure with a periodic pattern. For example, a plasmonic filter may comprise a metal nanograting. The metal nanostructure filters wavelengths of radiation by the surface plasmon effect and can be adjusted by varying the pitch of the periodic structure. However, the spectrum of a plasmonic filter highly depends on the incident angle of radiation, which limits application of the plasmonic filter.

Various embodiments of the present application are directed towards a narrow band filter with high transmission. In some embodiments, the filter comprises a first distributed Bragg reflector (DBR), a second DBR, a defect layer between the first and second DBRs, and a periodic arrangement of columnar structures. The columnar structures extend through the defect layer and have a refractive index different than a refractive index of the defect layer. The first and second DBRs create a low transmission band, and the defect layer creates a high transmission band dividing the low transmission band. The columnar structures shift the high transmission band towards lower or higher wavelengths depending upon a refractive index of the columnar structures and a fill factor (e.g., total volume) of the columnar structures.

Because of the columnar structures, the location of the high transmission band may be highly controlled. Further, a single mask may be used to form the filter with multiple different high transmission bands respectively at different regions of the filter. For example, the fill factor of the columnar structures may be high at a first region of the filter and may be low at a second region of the filter, such that the first and second regions have different high transmission bands. Further, because of the use of the defect layer to create the high transmission band, the high transmission band may be narrow. Further, because the first and second DBRs may be formed without absorptive materials (e.g., metal or some other absorptive material), high transmission may be achieved at the high transmission band.

With reference to FIG. 1, a cross-sectional view 100 of some embodiments of a narrow band filter 102 with high transmission is provided. The narrow band filter 102 may, for example, also be referred to as a photonic crystal filter. A first multilayer film 104 alternates between a first refractive index and a second refractive index from top to bottom, and an second multilayer film 106 alternates between the first refractive index and the second refractive index from top to bottom. In some embodiments, the first and second multilayer films 104, 106 are or define DBRs. For example, the first multilayer film 104 may be a first DBR and the second multilayer film 106 may be a second DBR. In some embodiments, the first and second multilayer films 104 are formed of transparent materials and/or materials with a low absorption for wavelengths to be transmitted by the narrow band filter 102. Low absorption may, for example, be absorption less than about 30%, 20%, or 10%. Other materials and/or absorptions are, however, amenable.

A defect layer 108 is between the first and second multilayer films 104, 106. In some embodiments, the defect layer 108 has a different refractive index than the first and second refractive indexes of the first and second multilayer films 104, 106. In some embodiments, a thickness Td of the defect layer 108 is different than individual layers (not shown) of the first and second multilayer films 104, 106 that have the first refractive index. In some of such embodiments, the defect layer 108 has the first refractive index. In some embodiments, the thickness Td of the defect layer 108 is different than individual layers (not shown) of the first and second multilayer films 104, 106 that have the second refractive index. In some of such embodiments, the defect layer 108 has the second refractive index. In some embodiments, the thickness Td of the defect layer 108 is between about 30-600 nanometers in such embodiments. Other thicknesses are, however, amenable for the defect layer 108.

A plurality of columnar structures 110 extends through the defect layer 108, from an upper or top surface of the defect layer 108 to a lower or bottom surface of the defect layer 108. For ease of illustration, only some of the columnar structures 110 are labeled 110. Further, the columnar structures 110 are in one or more periodic patterns and have a refractive index different than the first and second refractive indexes of the first and second multilayer films 104, 106. For example, the refractive index of the columnar structures 110 may, for example, be higher or lower than the first and second refractive indexes of the first and second multilayer films 104, 106. In some embodiments, the columnar structures 110 each individually has: 1) the refractive index; 2) the same width Wc as each other one of the columnar structures 110; 3) the same material composition as each other one of the columnar structures 110; 4) or any combination of the foregoing. The width Wc of the columnar structures 110 may, for example, be about 20-200 nanometers, but other values are amenable. In some embodiments, the columnar structures 110 are in an array and/or are evenly spaced by a pitch Pc. The pitch Pc may, for example, be about 40-800 nanometers, but other pitches are amenable.

During use of the narrow band filter 102, radiation 112 is received on a filter frontside 114 and is selectively transmitted to a filter backside 116 by constructive and destructive interface of reflections at interfaces between materials with different refractive indexes. The filter frontside 114 may, for example, be defined by the second multilayer film 106, and/or the filter backside 116 may, for example, be defined by the first multilayer film 104.

The first and second multilayer films 104, 106 define a low transmission band (i.e., a range of wavelengths) at which transmission from the filter frontside 114 to the filter backside 116 is low. Low transmission may, for example, be transmission less than about 40%, 30%, or 20%. Other transmissions are, however, amenable. The defect layer 108 defined a high transmission band (i.e., a range of wavelengths) at which transmission from the filter frontside 114 to the filter backside 116 is high. The high transmission band is narrow and divides the low transmission band into segments between lower and upper limits of the low transmission band. A narrow transmission band may, for example, be a transmission band with a width less than about 20, 35, or 50 nanometers and/or high transmission may, for example, be transmission in excess of about 80%, 90%, or 95%. Other widths and/or transmissions are, however, amenable. In some embodiments, the low and high transmission bands shift towards lower wavelengths as the average angle of incidence for the radiation 112 increases.

The columnar structures 110 shift the location of the high transmission band based on the refractive index of the columnar structures 110 and a fill factor of the columnar structures 110. The fill factor may, for example, be the total volume occupied by the columnar structures 110 and may, for example, be varied by changing the size of the columnar structures 110, spacing between the columnar structures 110, the shape of the columnar structures 110, some other property of the columnar structures 110, or any combination of the foregoing. When the columnar structures 110 have a refractive index less than the first and second refractive indexes of the first and second multilayer films 104, 106, increasing the fill factor shifts the high transmission band to lower wavelengths and decreasing the fill factor shifts the high transmission band to higher wavelengths. When the columnar structures 110 have a refractive index more than the first and second refractive indexes of the first and second multilayer films 104, 106, increasing the fill factor shifts the high transmission band to higher wavelengths and decreasing the fill factor shifts the high transmission band to lower wavelengths.

Because of the columnar structures 110, the location of the high transmission band may be controlled to a high degree. Further, because of the use of the defect layer 108 to define the high transmission band, the high transmission band may be narrow. Further yet, because the first and second multilayer films 104, 106 may be formed with clear materials and/or materials with a low absorption for wavelengths to be transmitted by the narrow band filter 102, high transmission may be achieved at the high transmission band.

Figure 2A:
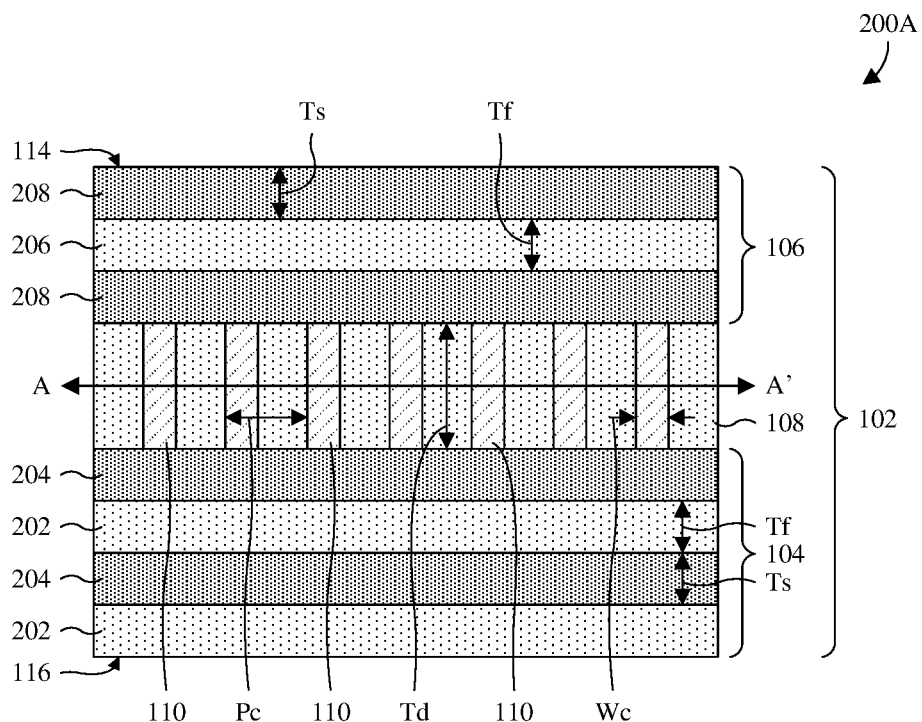
FIGS. 2A-2E illustrate cross-sectional views of various more detailed embodiments of the narrow band filter of FIG. 1 with different configurations of the defect layer.

With reference to FIG. 2A, a cross-sectional view 200A of some more detailed embodiments of the narrow band filter 102 of FIG. 1 is provided in which the defect layer 108 has the first refractive index of the first and second multilayer films 104, 106 and further has a thickness Td greater than thicknesses respectively of individual layers of the first and second multilayer films 104, 106. The first multilayer film 104 comprises one or more first layers 202 and one or more second layers 204, and the second multilayer film 106 comprises one or more third layers 206 and one or more fourth layers 208.

The first layer(s) 202 are alternatingly stacked (or interleaved) with the second layer(s) 204, and the third layer(s) 206 are alternatingly stacked (or interleaved) with the fourth layer(s) 208. The first and third layers 202, 206 each individually has: 1) the first refractive index; 2) the same thickness Tf as each other one of the first and third layers 202, 206; 3) the same material composition as each other one of the first and third layers 202, 206; 4) or any combination of the foregoing. The second and fourth layers 204, 208 each individually has: 1) the second refractive index; 2) the same thickness Ts as each other one of the second and fourth layers 204, 208; 3) the same composition as each other one of the second and fourth layers 204, 208; 4) or any combination of the foregoing. The first refractive index may, for example, be about 1.0-1.5, and the second refractive index may, for example, be about 1.7-4.5, or vice versa. Other values are, however, amenable. Further, the first refractive index may, for example, larger than the second refractive index or vice versa. The first, second, third, and fourth layers 202, 204, 206, 208 may, for example, be or comprise low absorption materials for wavelengths to be transmitted, transparent materials, dielectric materials, or any combination of the foregoing.

The defect layer 108 is between the first and second multilayer films 104, 106, such that a bottom surface of the defect layer 108 adjoins one of the second layer(s) 204 and a top surface of the defect layer 108 adjoins one of the fourth layer(s) 208. The defect layer 108 has a thickness Td different than the thickness Tf of the first and third layers 202, 206. For example, the thickness Td of the defect layer 108 may be larger than the thickness Tf of the first and third layers 202, 206. As another example, the thickness Td of the defect layer 108 may be smaller than the thickness Tf of the first and third layers 202, 206. In some embodiments, the thickness Td of the defect layer 108 is also different (e.g., larger or smaller) than the thickness Ts of the second and fourth layers 204, 208. Further, the defect layer 108 has the same material composition and/or the same refractive index as the first and third layers 202, 206.

In some embodiments, each of the first and third layers 202, 206 is or comprises silicon oxide (e.g., $SiO_2$) and each of the second and fourth layers 204, 208 is or comprises titanium oxide (e.g., $TiO_2$), such that the second and fourth layers 204, 208 have a refractive index greater than the first and third layers 202, 206. In some of such embodiments, the defect layer 108 also is or comprises silicon oxide. In other embodiments, each of the first and third layers 202, 206 is or comprises titanium oxide and each of the second and fourth layers 204, 208 is or comprises silicon oxide, such that the second and fourth layers 204, 208 have a refractive index less than the first and third layers 202, 206. In some of such embodiments, the defect layer 108 also is or comprises titanium oxide. Notwithstanding the use of silicon oxide and titanium oxide for the preceding embodiments, other materials are amenable for the defect layer 108 and the first, second, third, and fourth layers 202, 204, 206, 208.

In some embodiments, each of the first and third layers 202, 206 has a thickness Tf of about 25-300 nanometers and each of the second and fourth layers 204, 208 has a thickness Ts of about 15-200 nanometers. Such embodiments may, for example, arise when the first and third layers 202, 206 are or comprise silicon oxide and the second and fourth layers 204, 208 are or comprise titanium oxide. In some embodiments, each of the first and third layers 202, 206 has a thickness Tf of about 15-200 nanometers and each of the second and fourth layers 204, 208 has a thickness Ts of about 25-300 nanometers. Such embodiments may, for example, arise when the first and third layers 202, 206 are or comprise titanium oxide and the second and fourth layers 204, 208 are or comprise silicon oxide. Notwithstanding the thickness values for the preceding embodiments, other thickness values are amenable for and the first, second, third, and fourth layers 202, 204, 206, 208.

Figure 2B:
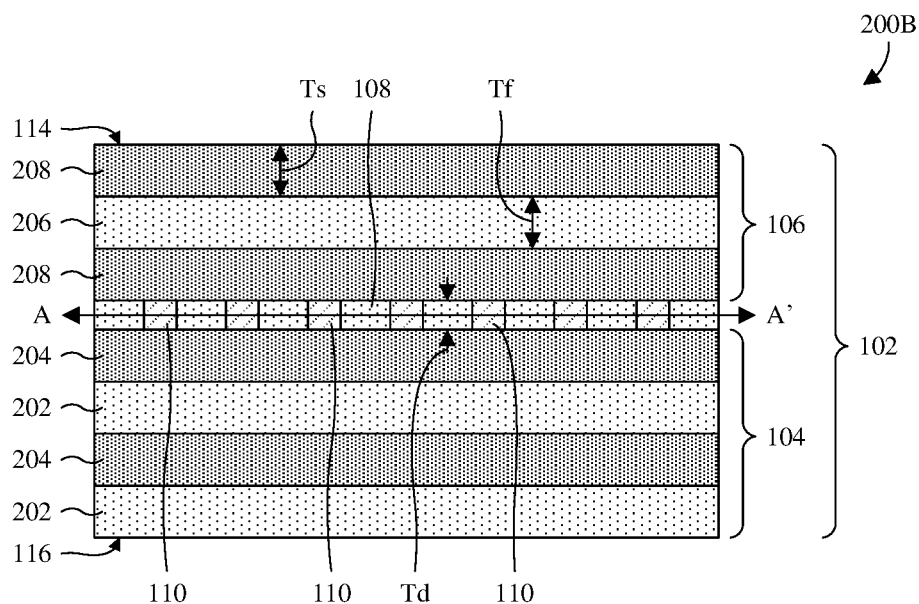

With reference to FIG. 2B, a cross-sectional view 200B of some alternative embodiments of the narrow band filter 102 of FIG. 2A is provided in which the defect layer 108 has a thickness Td less than thicknesses respectively of individual layers of the first and second multilayer films 104, 106.

Figure 2C:
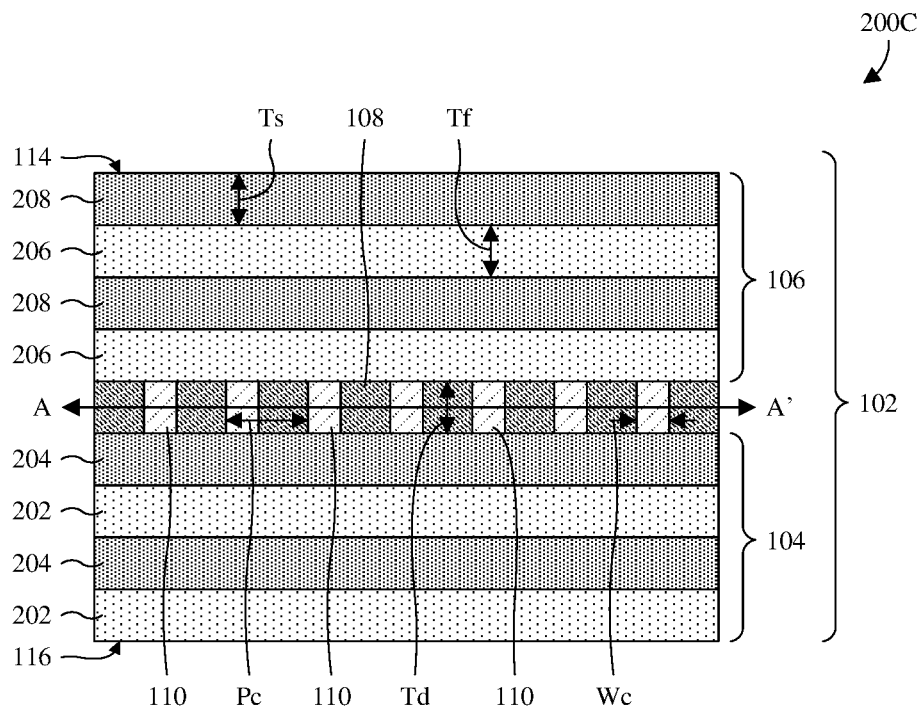

With reference to FIG. 2C, a cross-sectional view 200C of some alternative embodiments of the narrow band filter 102 of FIG. 2A is provided in which the defect layer 108 has a refractive index different than the first and second refractive indexes of first and second multilayer films 104, 106. For example, the refractive index of the defect layer 108 may be less than or more than the first and second refractive indexes of the first and second multilayer films 104, 106. Further, the defect layer 108 has a material composition different than the first, second, third, and fourth layers 202, 204, 206, 208

In some embodiments, the first and second refractive indexes of the first and second multilayer films 104, 106 are different than and between the refractive index of the columnar structures 110 and the refractive index of the defect layer 108. In some embodiments, a bottom surface of the defect layer 108 adjoins one of the second layer(s) 204 and a top surface of the defect layer 108 adjoins one of the third layer(s) 206. In other embodiments, a bottom surface of the defect layer 108 adjoins one of the first layer(s) 202 and a top surface of the defect layer 108 adjoins one of the fourth layer(s) 208. In some embodiments, the thickness Td of the defect layer 108 is the same as the thickness Tf of the first and third layers 202, 206 and/or is the same as the thickness Ts of the second and fourth layers 204, 208. In other embodiments, the thickness Td of the defect layer 108 is different than the thickness Tf of the first and third layers 202, 206 and/or the thickness Ts of the second and fourth layers 204, 208.

Figure 2D:
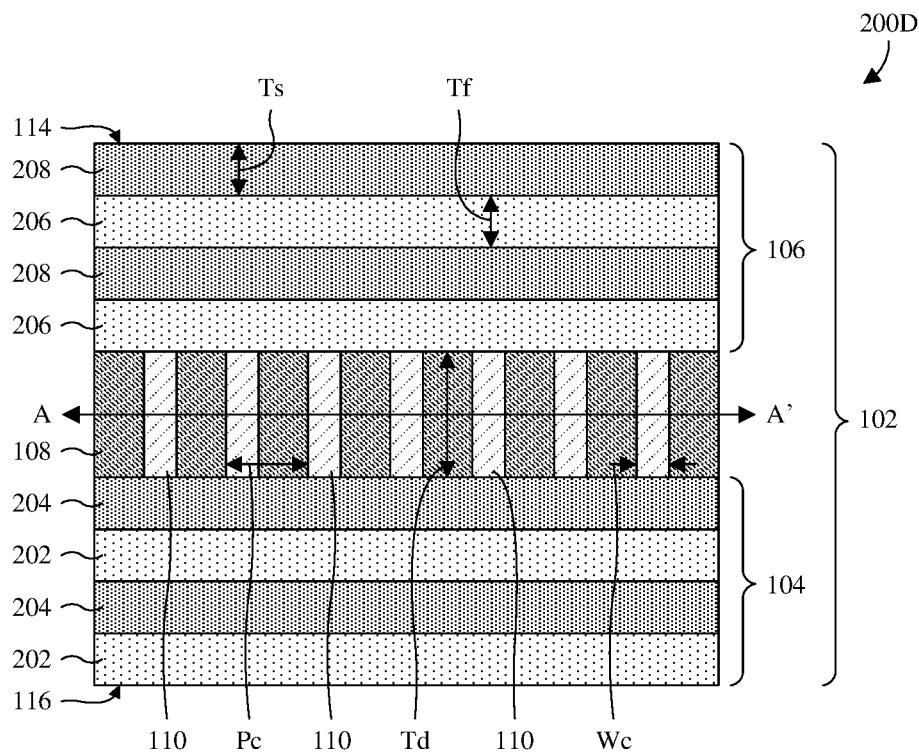

With reference to FIG. 2D, a cross-sectional view 200D of some alternative embodiments of the narrow band filter 102 of FIG. 2C is provided in which the defect layer 108 has a refractive index different than the first and second refractive indexes of first and second multilayer films 104, 106 and further has a thickness Td greater than thicknesses respectively of individual layers of the first and second multilayer films 104, 106.

Figure 2E:
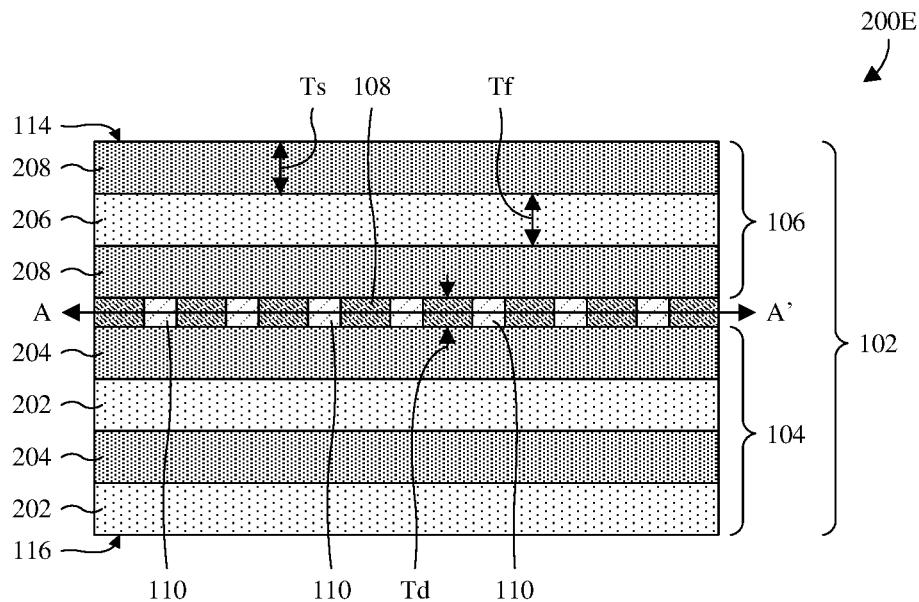

With reference to FIG. 2E, a cross-sectional view 200E of some alternative embodiments of the narrow band filter 102 of FIG. 2C is provided in which the defect layer 108 has a refractive index different than the first and second refractive indexes of first and second multilayer films 104, 106 and further has a thickness Td less than thicknesses respectively of individual layers of the first and second multilayer films 104, 106.

With reference to FIGS. 3A-3E, cross-sectional views 300A-300E of some alternative embodiments of the narrow band filter 102 respectively of FIGS. 2A-2E are provided in which the columnar structures 110 extend through the first and second multilayer films 104, 106 and the defect layer 108, from an upper or top surface of the second multilayer film 106 to a lower or bottom surface of the first multilayer film 104.

Figure 3A:
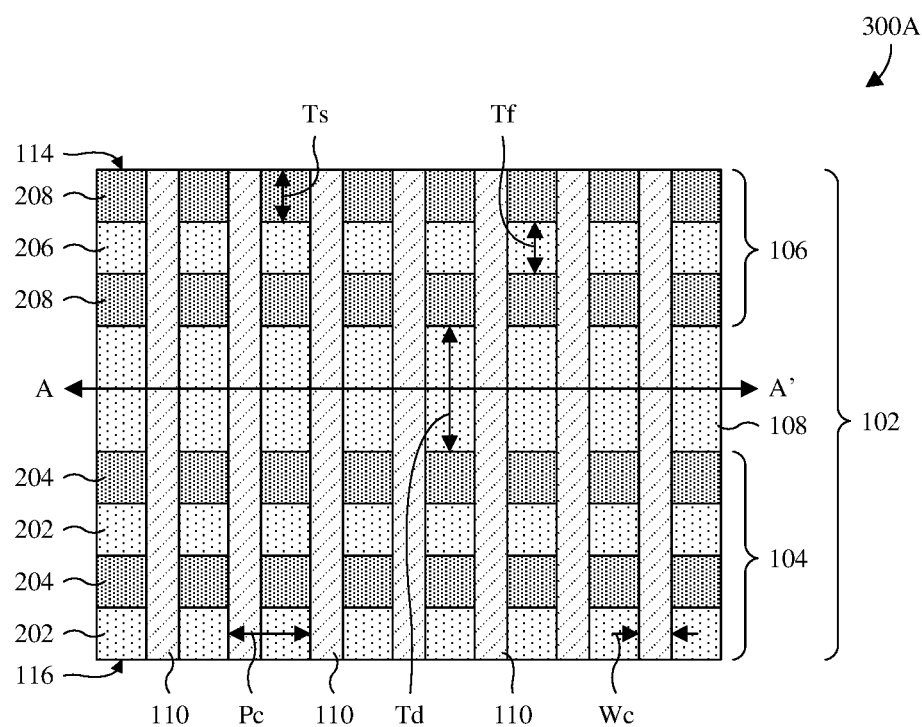
FIGS. 3A-3E illustrate cross-sectional views of some alternative embodiments of the narrow band filters respectively of FIGS. 2A-2E in which the columnar structures extend through first and second multilayer films and the defect layer.
Figure 3B:
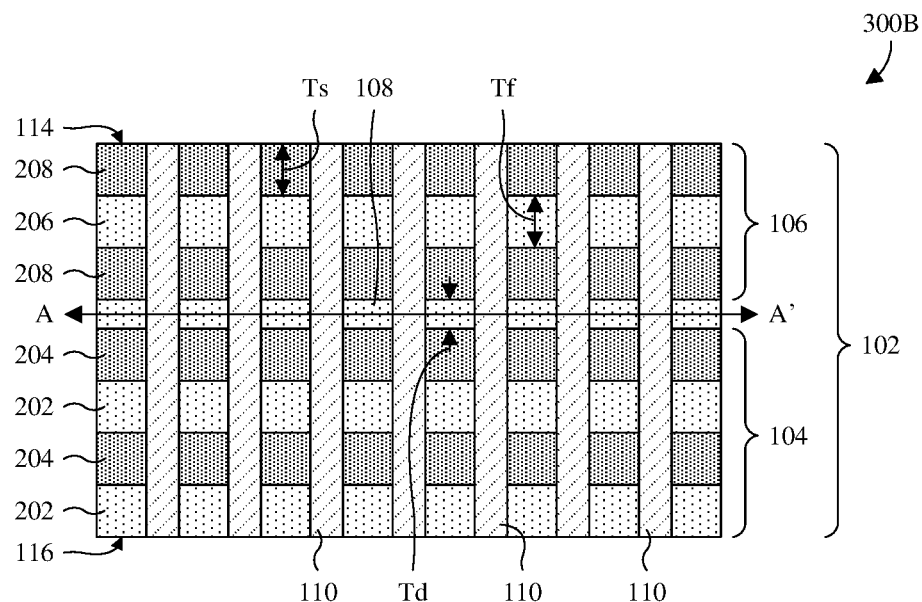
Figure 3C:
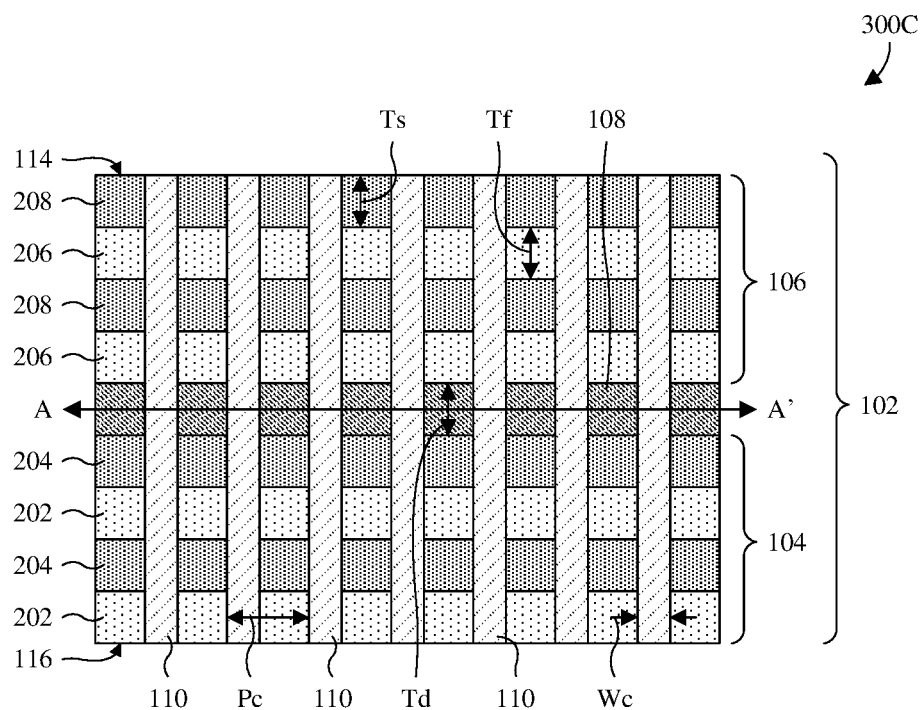
Figure 3D:
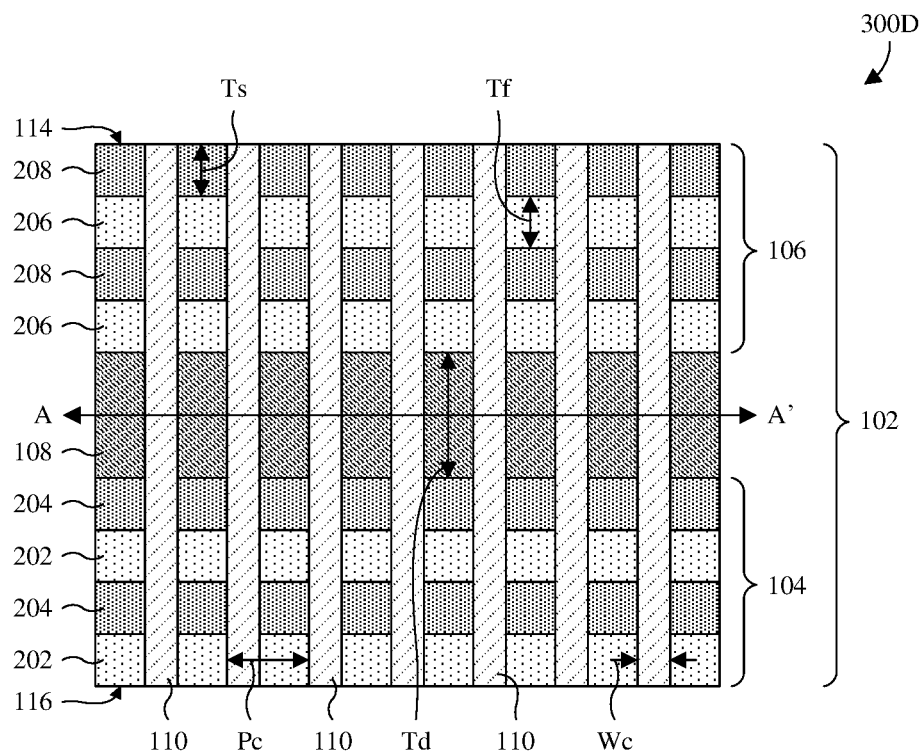
Figure 3E:
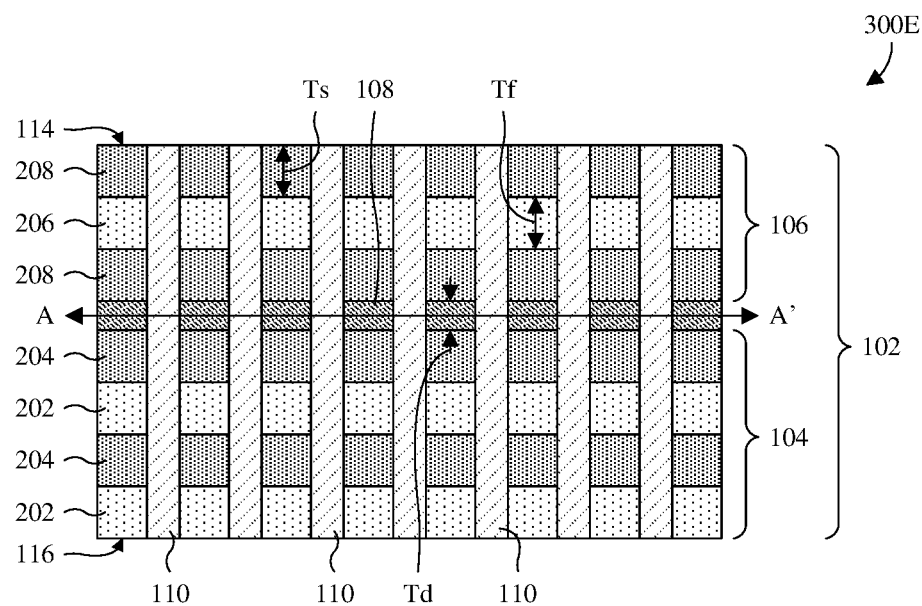
Figure 4:
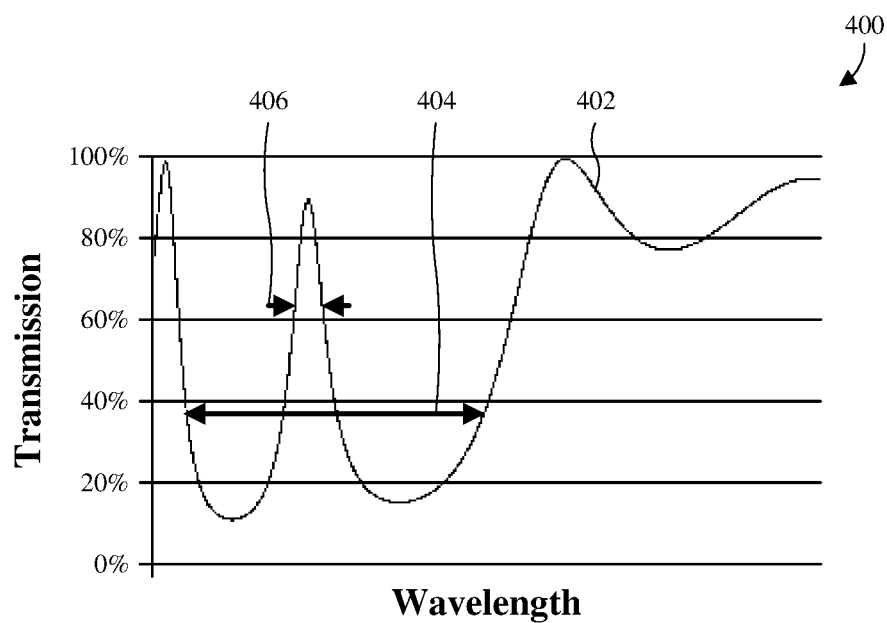
FIG. 4 illustrates a graph of some embodiments a curve describing transmission as a function of wavelength for the narrow band filter in any one of FIGS. 2A-2E and 3A-3E.

With reference to FIG. 4, a graph 400 of some embodiments a curve 402 describing transmission as a function of wavelength for the narrow band filter 102 of FIGS. 2A-2E and 3A-3E is provided. The first, second, third, and fourth layers 202, 204, 206, 208 of FIGS. 2A-2E and 3A-3E define a low transmission band 404. The sharpness of the low transmission band 404 may, for example, be increased by increasing the number of first and second layers 202, 204 and/or by increasing the number of third and fourth layers 206, 208. The sharpness of the low transmission band 404 may, for example, be the steepness of the curve 402 (e.g., the ratio of rise over run) at lower and upper limits of the low transmission band 404.

The position of the low transmission band 404 depends on the thicknesses Tf, Ts (see FIGS. 2A-2E and 3A-3E) of the first, second, third, and fourth layers 202, 204, 206, 208 and the refractive indexes of the first, second, third, and fourth layers 202, 204, 206, 208. For example, the central wavelength $\lambda$ of the low transmission band 404 may be as follows: $\lambda=2(n1Tf+n2Ts)/m$. n1 and n2 are respectively the first refractive index of the first and third layers 202, 206 and the second refractive index of the second and fourth layers 204, 208. Tf and Ts are respectively the thickness of the first and third layers 202, 206 and the thickness of the second and fourth layers 204, 208. m is the order of the optical response, which is an integer larger than zero.

The width $\Delta\lambda$ of the low transmission band 404 depends on the central wavelength $\lambda$ of the low transmission band 404 (see above), and also depends on the refractive indexes of the first, second, third, and fourth layers 202, 204, 206, 208. For example, the width $\Delta\lambda$ of the low transmission band 404 may be as follows: $\Delta\lambda=\lambda\Delta n/2$. $\Delta n$ is the difference between the first refractive index of the first and third layers 202, 206 and the second refractive index of the second and fourth layers 204, 208.

The defect layer 108 of FIGS. 2A-2E and 3A-3E defines a high transmission band 406 dividing the low transmission band 404 into lower and upper segments. But for the defect layer 108, the high transmission band 406 may, for example, have an inverted bell shape or some other suitable shape. The peak of the high transmission band 406 moves towards higher wavelengths as the thickness Td (see FIGS. 2A-2E and 3A-3E) of the defect layer 108 increases and/or the refractive index of the defect layer 108 increases. Further, the peak of the high transmission band 406 moves towards lower wavelengths as the thickness Td of the defect layer 108 decreases and/or the refractive index of the defect layer 108 decreases. While not shown, in some embodiments, increasing the thickness Td of the defect layer 108 may lead to multiple high transmission bands. The central wavelength $\lambda_t$ of such a high transmission band may, for example, be as follows: $\lambda_t \alpha (n3Td)/(t+0.5)$. n3 is the refractive index of the defect layer 108, and Td is the thickness of the defect layer 108. t is the index of the high transmission band. For example, where there are two high transmission bands, t=1 would be used for the first high transmission band and t=2 would be used for the second high transmission band.

The columnar structures 110 of FIGS. 2A-2E and 3A-3E shift the peak of the high transmission band 406 towards lower or higher wavelengths depending upon a refractive index of the columnar structures 110 and a fill factor of the columnar structures 110. Further, as noted above, the columnar structures 110 may, for example, be evenly spaced by a pitch Pc (see FIGS. 2A-2E and 3A-3E). In some embodiments, the pitch Pc is less than the peak wavelength of the high transmission band 406 and/or is less than the quotient from dividing the peak wavelength by the refractive index of the second and fourth layers 204, 208. By limiting the pitch Pc as such, side peaks may, for example, be avoided. Side peaks are peaks to sides of the high transmission band 406, in the low transmission band 404, and may, for example, be caused by diffraction.

Figure 5A:
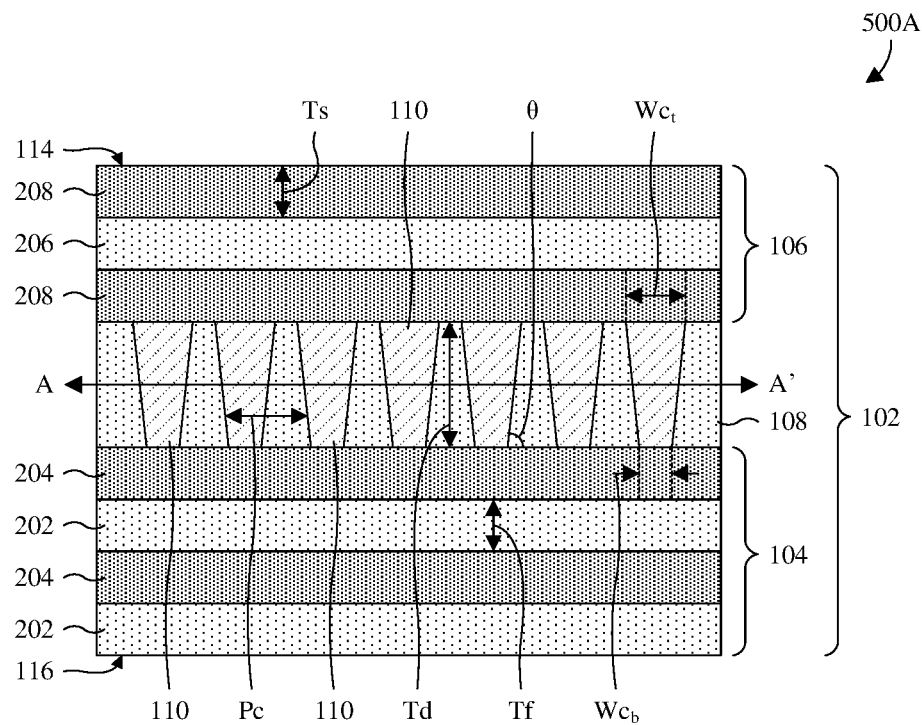
FIGS. 5A-5D illustrate cross-sectional views of some alternative embodiments of the narrow band filters of FIGS. 2A and 3A in which the columnar structures have tapered widths.

With reference to FIG. 5A, a cross-sectional view 500A of some embodiments of the narrow band filter 102 of FIG. 2A is provided in which the columnar structures 110 have tapered widths decreasing from top to bottom. For example, the columnar structures 110 may each have a top width $Wc_t$, a bottom width $Wc_b$ less than the top width $Wc_t$, and sidewalls at an angle $\theta$ less than about 90 degrees. In some embodiments, the top width $Wc_t$ is about 0.2-0.3 micrometers or about 0.22 micrometers, the bottom width $Wc_b$ is about 0.20-0.30 micrometers or about 0.20 micrometers, the angle $\theta$ is about 80-89 degrees or about 87 degrees, or any combination of the foregoing. Other values are, however, amenable for the top width $Wc_t$, the bottom width $Wc_b$, and the angle $\theta$.

If the columnar structures 110 had the top width $Wc_t$ uniformly from top to bottom, the columnar structures 110 would have a first fill factor and the high transmission band 406 (see FIG. 4) would have a peak at a first wavelength. If the columnar structures 110 had the bottom width $Wc_b$ uniformly from bottom to top, the columnar structures 110 would have a second fill factor less than the first fill factor. Further, the high transmission band 406 would have a peak at a second wavelength different than the first wavelength due to differences in fill factors. By tapering widths of the columnar structures 110, the columnar structures 110 have a third fill factor between the first and second fill factors. As such, the high transmission band 406 may have a peak at a third wavelength between the first and second wavelengths. Therefore, tapering widths of the columnar structures 110 allows additional control over the fill factor of the columnar structures 110 and the peak location of the high transmission band 406.

Figure 5B:
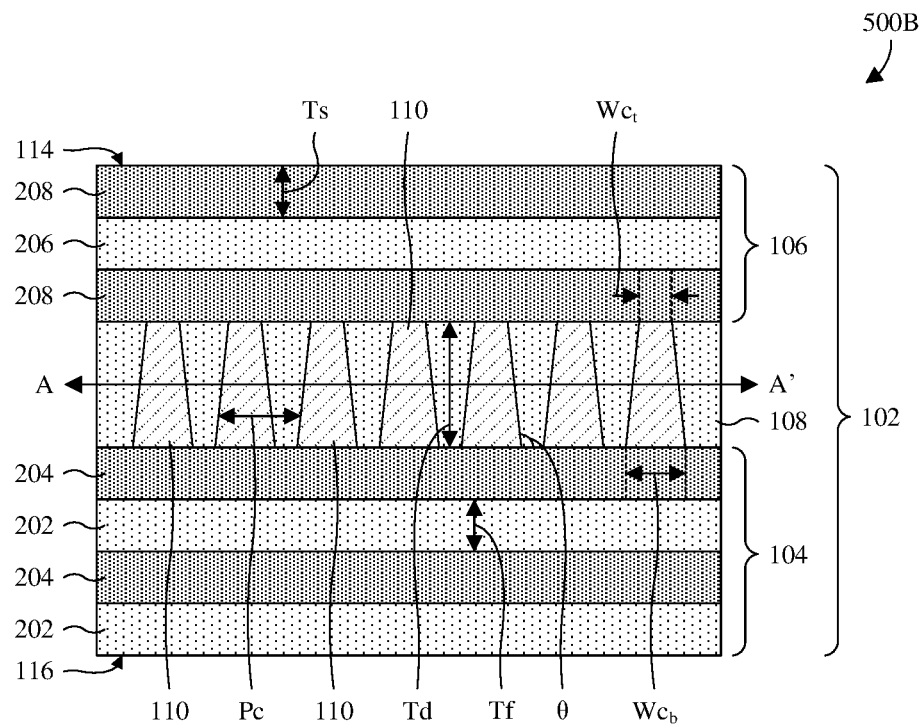

With reference to FIG. 5B, a cross-sectional view 500B of some alternative embodiments of the narrow band filter 102 of FIG. 5A is provided in which widths of the columnar structures 110 increase from top to bottom. As such, the columnar structures 110 may, for example, each have sidewalls at an angle θ greater than about 90 degrees. In some embodiments, the angle θ is about 91-100 degrees or some other suitable value. However, if the angle θ is too large (e.g., greater than about 100 degrees or some other suitable value), it may be difficult to deposit material of the columnar structures 110 into openings within which the columnar structures 110 are formed.

Figure 5C:
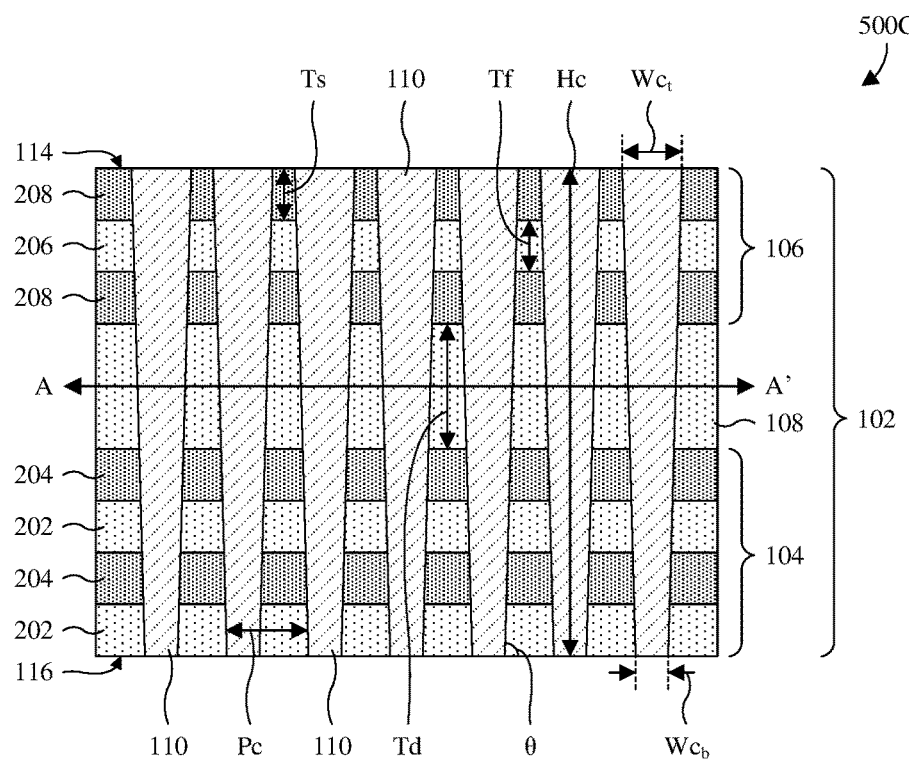
Figure 5D:
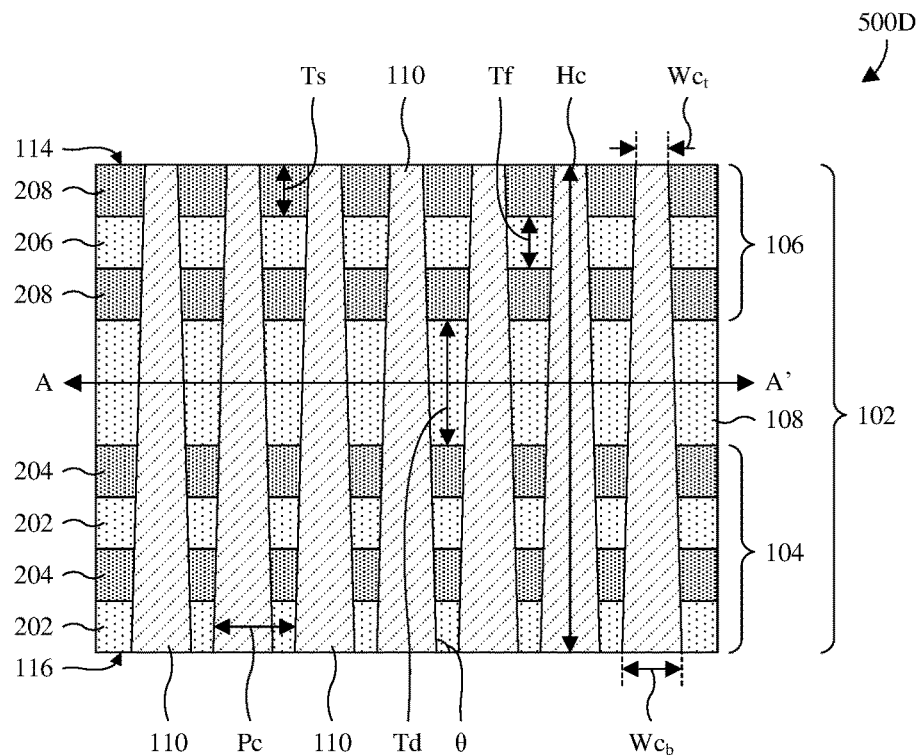

With reference to FIGS. 5C and 5D, cross-sectional views 500C, 500D of some alternative embodiments of the narrow band filter 102 of FIG. 3A is provided in which the columnar structures 110 have tapered widths as illustrated and described respectively with regard to FIGS. 5A and 5B. The columnar structures 110 of FIG. 5C have tapered widths decreasing from top to bottom, as illustrated and described with regard to FIG. 5A. The columnar structures 110 of FIG. 5D have tapered widths increasing from top to bottom, as illustrated and described with regard to FIG. 5B. In some embodiments, each of the columnar structures 110 further has a height Hc that is at least an order of magnitude greater than the top width $Wc_t$ and/or the bottom width $Wc_b$. The height Hc may, for example, be about 1.5-2.5 micrometers or about 2.0 micrometers. However, other values for the height Hc are amenable.

While FIGS. 5A-5D illustrate the columnar structures 110 with tapered widths using embodiments of the narrow band filter 102 in FIGS. 2A and 3A, it is to be understood that the columnar structures 110 in any one of FIGS. 1, 2B-2E, and 3B-3E may have tapered widths in other embodiments. For example, the columnar structures 110 of FIG. 2D may have tapered widths decreasing from top to bottom as illustrated and described with regard to FIG. 5A.

Figure 6A:
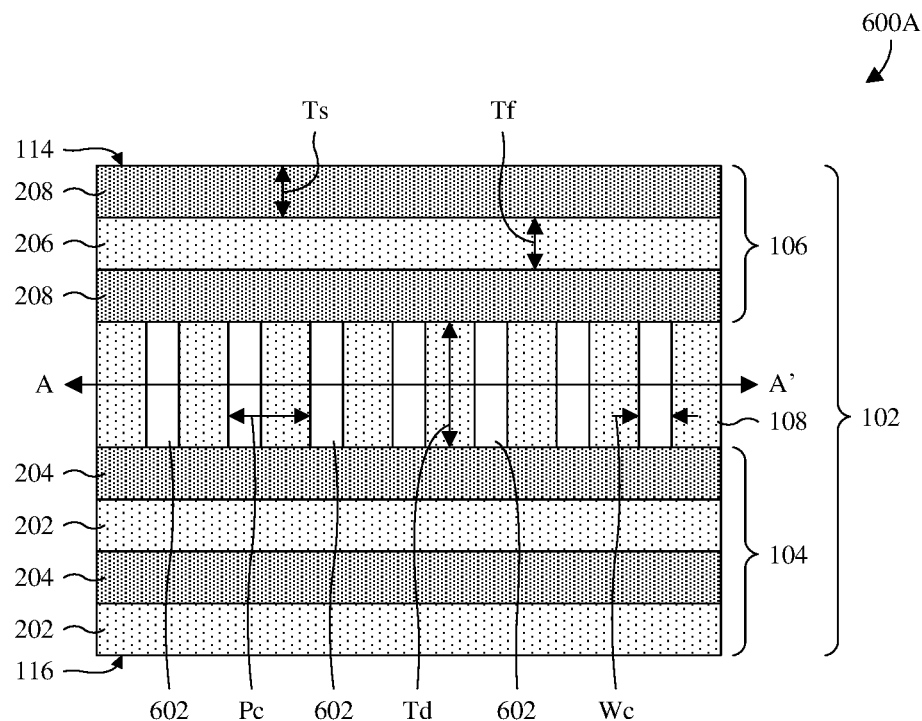
FIGS. 6A and 6B illustrate cross-sectional views of some alternative embodiments of the narrow band filters of FIGS. 2A and 3A in which columnar cavities are used in place of the columnar structures.

With reference to FIG. 6A, a cross-sectional view 600A of some alternative embodiments of the narrow band filter 102 of FIG. 2A is provided in which columnar cavities 602 are used in place of the columnar structures 110. For ease of illustration, only some of the columnar cavities 602 are labeled 602. The columnar cavities 602 may, for example, be vacuumed, filled with air, filled with some other suitable gases, or any combination of the foregoing. Further, the columnar cavities 602 save material costs.

Figure 6B:
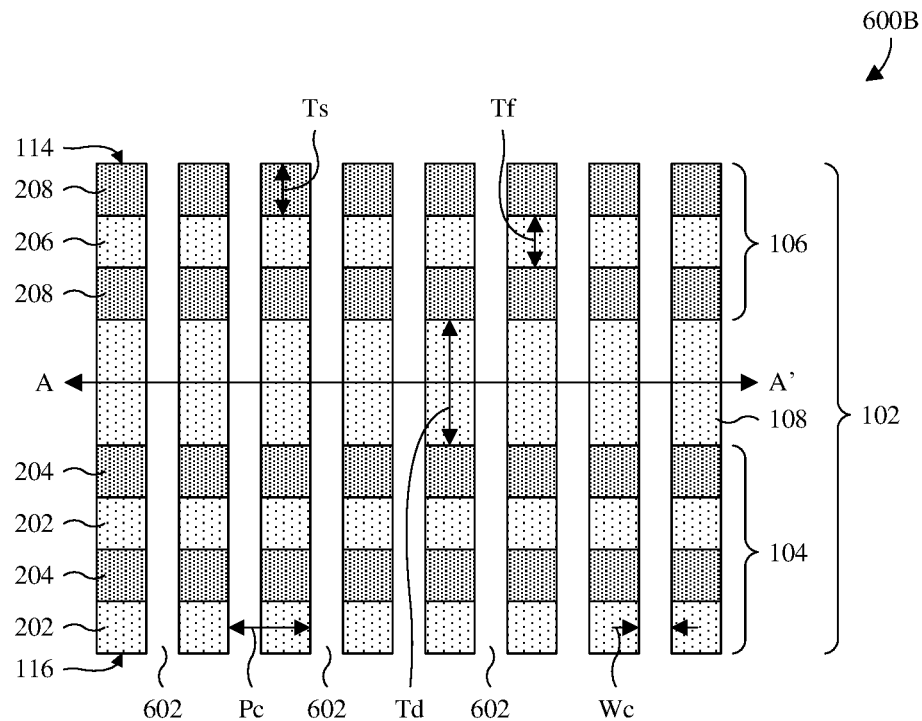

With reference to FIG. 6B, a cross-sectional view 600B of some alternative embodiments of the narrow band filter 102 of FIG. 3A is provided in which in which the columnar cavities 602 are used in place of the columnar structures 110.

While FIGS. 6A and 6B illustrate the columnar cavities 602 using embodiments of the narrow band filter 102 in FIGS. 2A and 3A, it is to be understood that the columnar cavities 602 may be used in any one of FIGS. 1, 2B-2E, 3B-3E, and 5A-5D in other embodiments. For example, the columnar structures 110 of FIG. 3D may be replaced with the columnar cavities 602.

Figure 7A:
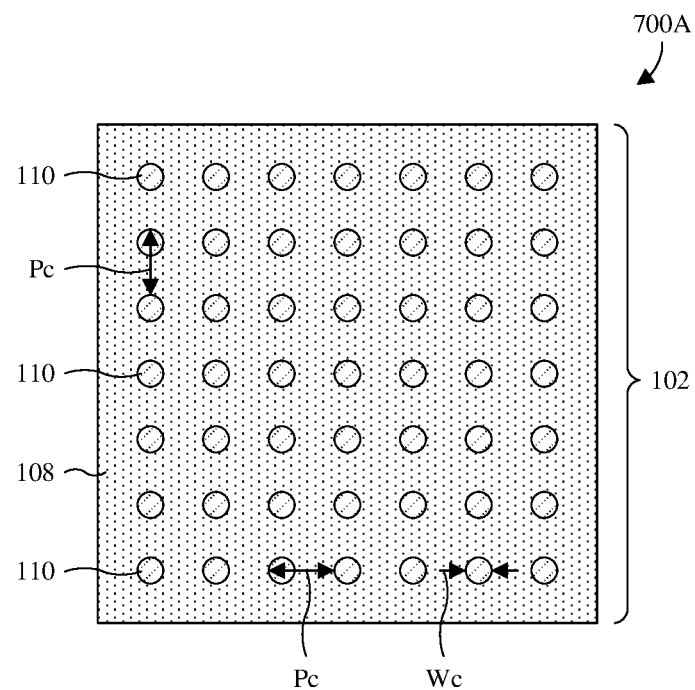
FIGS. 7A-7G illustrate top layouts of various embodiments the columnar structures in any one of FIGS. 1, 2A-2E, 3A-3E, and 5A-5D.

With reference to FIG. 7A, a layout view 700A of some embodiments of the columnar structures 110 in any one of FIGS. 1, 2A-2E, 3A-3E, and 5A-5D is provided. The layout view 700A may, for example, be taken along line A-A' in FIGS. 1, 2A-2E, 3A-3E, and 5A-5D. The columnar structures 110 each have a circular layout and are arranged in a plurality of rows and a plurality of columns to define an array. Other layouts are, however, amenable. Further, the columnar structures 110 fully populate the rows and the columns. In some embodiments, each row or the array is spaced from each neighboring row by a pitch Pc, and/or each column of the array is spaced from each neighboring column of the array by the pitch Pc.

Figure 7B:
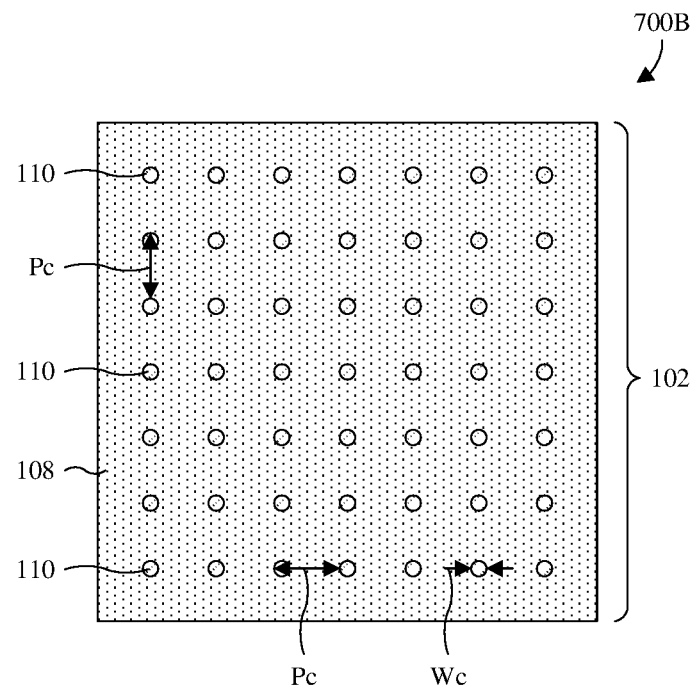

With reference to FIG. 7B, a layout view 700B of some alternative embodiments of the columnar structures 110 of FIG. 7A is provided in which a width Wc of the columnar structures 110 is reduced. By reducing the width Wc of the columnar structures 110, the fill factor of the columnar structures 110 is reduced. By decreasing the fill factor, the high transmission band of the narrow band filter 102 shifts compared to the high transmission band of FIG. 7A. For example, the high transmission band shifts to higher wavelengths compared to the high transmission band of FIG. 7A when the columnar structures 110 have a refractive index less than the first and second refractive indexes of the first and second multilayer films 104, 106 (see FIGS. 1, 2A-2E, 3A-3E, and 5A-5D). As another example, the high transmission band shifts to lower wavelengths compared to the high transmission band of FIG. 7A when the columnar structures 110 have a refractive index more than the first and second refractive indexes of the first and second multilayer films 104, 106.

Figure 7C:
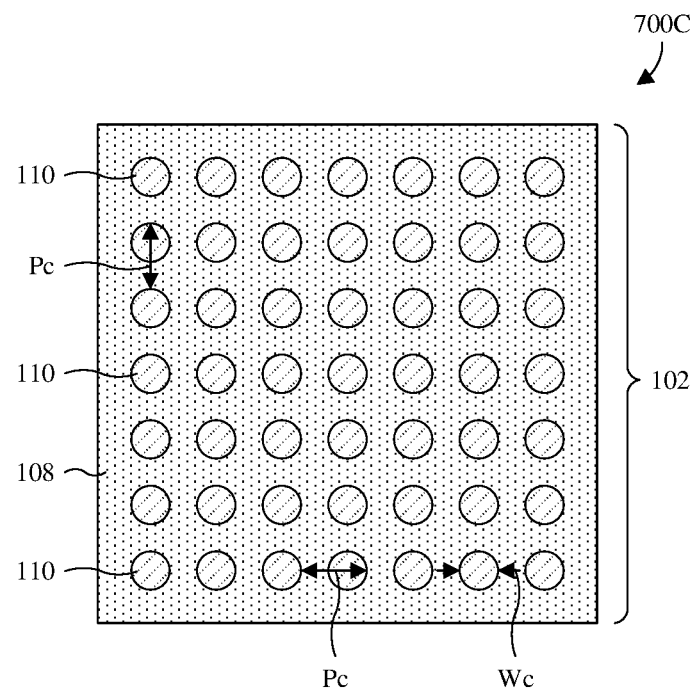

With reference to FIG. 7C, a layout view 700C of some alternative embodiments of the columnar structures 110 of FIG. 7A is provided in which a width Wc of the columnar structures 110 is increased. By increasing the width Wc of the columnar structures 110, the fill factor of the columnar structures 110 is increased. By increasing the fill factor, the high transmission band of the narrow band filter 102 shifts compared to the high transmission band of FIG. 7A. For example, the high transmission band shifts to lower wavelengths compared to the high transmission band of FIG. 7A when the columnar structures 110 have a refractive index less than the first and second refractive indexes of the first and second multilayer films 104, 106 (see FIGS. 1, 2A-2E, 3A-3E, and 5A-5D). As another example, the high transmission band shifts to higher wavelengths compared to the high transmission band of FIG. 7A when the columnar structures 110 have a refractive index more than the first and second refractive indexes of the first and second multilayer films 104, 106.

Figure 7D:
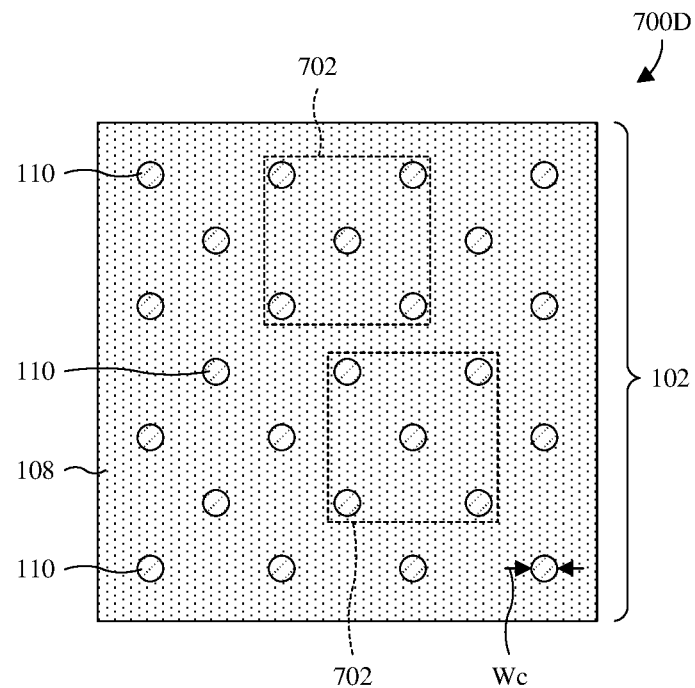
Figure 7E:
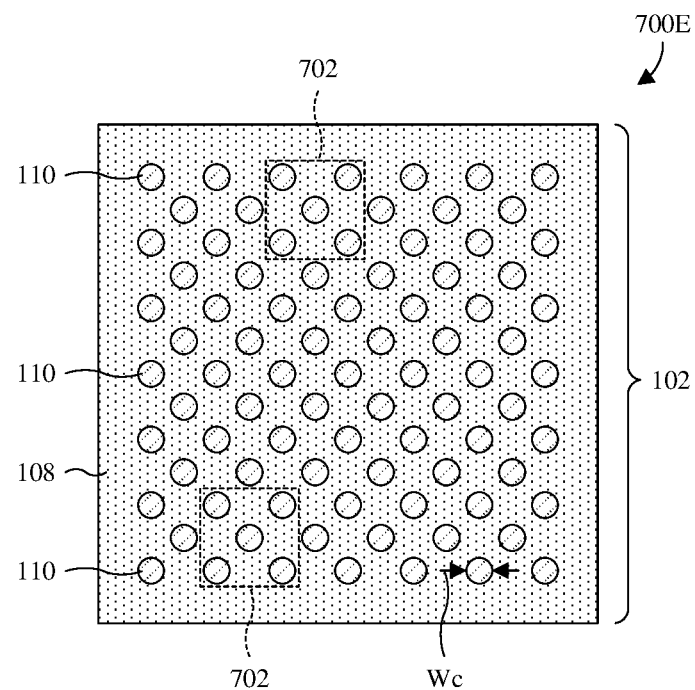

With reference to FIGS. 7D and 7E, layout views 700D, 700E of some alternative embodiments of the columnar structures 110 of FIG. 7A are provided in which a density of the columnar structures 110 is respectively reduced and increased. In FIG. 7D, the density is reduced by removing columnar structures 110 so the columnar structures 110 define a plurality of quincunx patterns 702. In FIG. 7E, the density of the columnar structures 110 is increased by adding columnar structures 110 so the columnar structures 110 define a plurality of quincunx patterns 702. For ease of illustration, only some of the quincunx patterns 702 are labeled 702 in FIGS. 7D and 7E. In some embodiments, the quincunx patterns 702 are in a plurality of rows and a plurality of columns, where each quincunx pattern 702 overlaps with each quincunx pattern 702 in a neighboring row and each quincunx pattern 702 in a neighboring column.

By decreasing or increasing the density of the columnar structures 110, the fill factor of the columnar structures 110 is respectively decreased or increased. By decreasing or increasing the fill factor, the high transmission band of the narrow band filter 102 shifts higher or lower depending upon a refractive index of the columnar structures 110. See the discussion regarding FIGS. 7B and 7C for more detail.

Figure 7F:
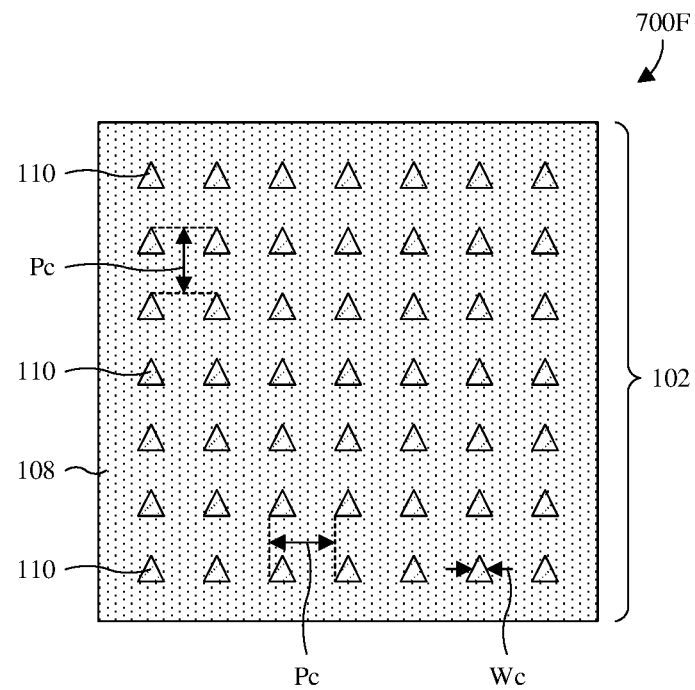
Figure 7G:
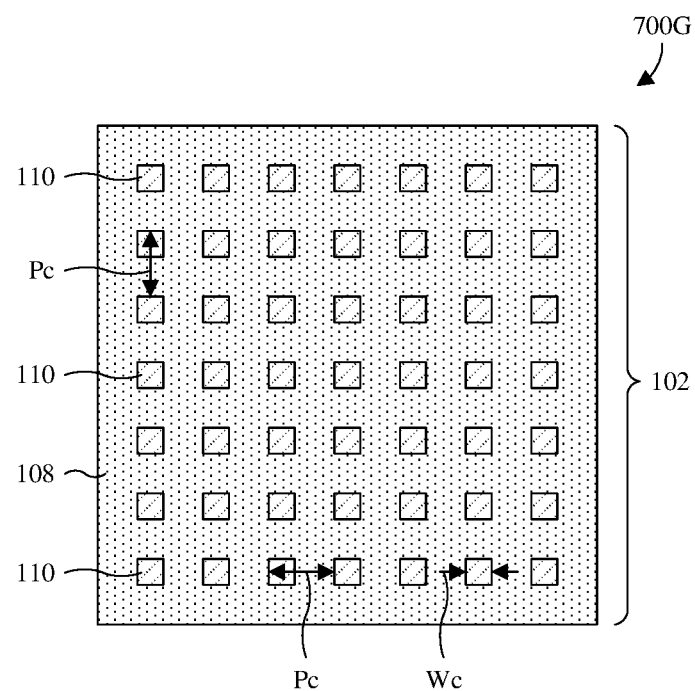

With reference to FIGS. 7F and 7G, layout views 700F, 700G of some alternative embodiments of the columnar structures 110 of FIG. 7A are provided in which the columnar structures 110 have different layout shapes. In FIG. 7F, the columnar structures 110 each have a triangular layout in which the three side lengths of the triangular layout are the same as the width Wc of FIG. 7A. As such, the area of the triangular layout is smaller than that of the circular layout of FIG. 7A, and the columnar structures 110 have a smaller fill factor than in FIG. 7A. In FIG. 7G, the columnar structures 110 each have a square layout in which the four side lengths of the square layout are the same as the width Wc of FIG. 7A. As such, the area of the square layout is larger than that of the circular layout of FIG. 7A, and the columnar structures 110 have a larger fill factor than in FIG. 7A. By decreasing or increasing the fill factor, the high transmission band of the narrow band filter 102 shifts higher or lower depending upon a refractive index of the columnar structures 110. See the discussion regarding FIGS. 7B and 7C for more detail.

While FIGS. 7A-7E illustrate the columnar structures 110 with circular layouts, other layouts are amenable. For example, the columnar structures 110 in any one of FIGS. 7A-7E may have the triangular layout of FIG. 7F, the square layout of FIG. 7G, or some other suitable layout in other embodiments. Further, while FIGS. 7A-7G are focused on layouts of the columnar structures 110 in FIGS. 1, 2A-2E, 3A-3E, and 5A-5D, the layouts are applicable to the columnar cavities 602 in FIGS. 6A and 6B. Therefore, the columnar structures 110 in FIGS. 7A-7G may be replaced by the columnar cavities 602 in FIGS. 6A and 6B in other embodiments.

Figure 8:
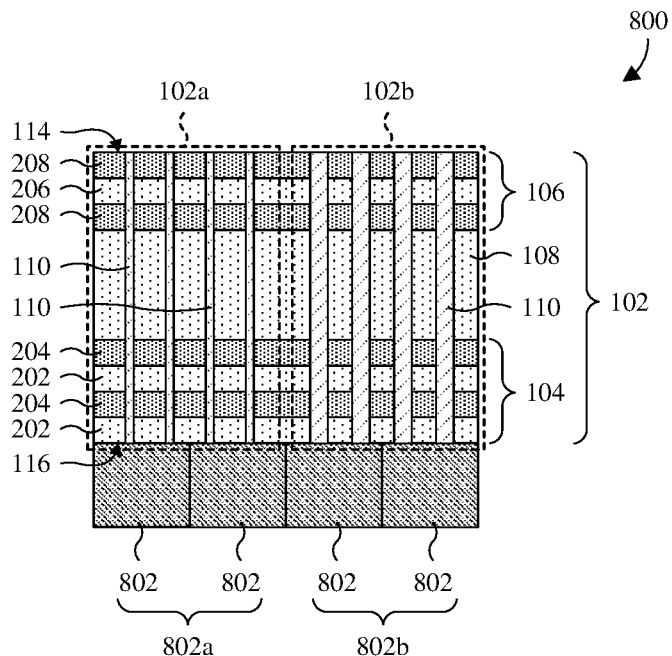
FIG. 8 illustrate a cross-sectional view of an integrated chip comprising the narrow band filter of FIG. 3A in which the narrow band filter 102 has a first region and a second region respectively with different fill factors for the columnar structures.

With reference to FIG. 8, a cross-sectional view 800 of some embodiments of an integrated chip comprising the narrow band filter 102 of FIG. 3A is provided in which the narrow band filter 102 has a first region 102a and a second region 102b respectively with different fill factors for the columnar structures 110. For example, the first region 102a of the narrow band filter 102 may have a fill factor less than that of the second region 102b of the narrow band filter 102. A fill factor for a region of the narrow band filter 102 may, for example, be the total volume of columnar structures 110 in the region.

Because the fill factor varies between the first and second regions 102a, 102b of the narrow band filter 102, the high transmission band of the narrow band filter 102 varies between the first and second regions 102a, 102b. When the columnar structures 110 have a refractive index less than those of the first and second multilayer films 104, 106, increasing the fill factor shifts the high transmission band to lower wavelengths and decreasing the fill factor shifts the high transmission band to higher wavelengths. When the columnar structures 110 have a refractive index more than those of the first and second multilayer films 104, 106, increasing the fill factor shifts the high transmission band to higher wavelengths and decreasing the fill factor shifts the high transmission band to lower wavelengths.

In some embodiments, the first and second regions 102a, 102b of the narrow band filter 102 each have a top surface area greater than about 4 micrometers squared. As top surface area decreases, transmission efficiency may, for example, decrease. Below about 4 micrometers squared, transmission efficiency may be too low for meaningful use. Such low transmission efficiency may, for example, be transmission efficiency below about 40%, 30%, or 20%. Other low transmission efficiencies are, however, amenable. Further, in some embodiments, the first and second regions 102a, 102b of the narrow band filter 102 correspond to pixel sensors. For example, the first and second regions 102a, 102b may correspond to pixel sensors with a one-to-one correspondence. Other correspondences are, however, amenable. The pixel sensors may, for example, be active pixel sensors (APSs) or some other suitable pixel sensors.

A plurality of photodetectors 802 is directly under the narrow band filter 102. A first set 802a of the photodetectors 802 underlies the first region 102a of the narrow band filter 102, and a second set 802b of the photodetectors 802 underlies the second region 102b of the narrow band filter 102 overlies. The photodetectors 802 may, for example, be or comprise photodiodes or some other suitable photodetectors. Because the high transmission band of the narrow band filter 102 varies between the first and second regions 102a, 102b of the narrow band filter 102, the narrow band filter 102 selectively passes a first range of wavelengths to the first set 802a of the photodetectors 802, and selectively passes a second range of wavelengths to the second set 802b of the photodetectors 802. For example, the narrow band filter 102 may pass red wavelengths of radiation to the first set 802a of the photodetectors 802 via the first region 102a of the narrow band filter 102, while blocking blue wavelengths of radiation via the first region 102a. As another example, the narrow band filter 102 may pass blue wavelengths of radiation to the second set 802b of the photodetectors 802 via the second region 102b of the narrow band filter 102, while blocking red wavelengths of radiation via the second region 102b.

In some embodiments, the photodetectors 802 are unable to discriminate between different wavelengths of radiation. For example, the photodetectors 802 may be color blind. Therefore, by selectively passing different ranges of wavelengths respectively to the photodetectors 802 with the narrow band filter 102, the photodetectors 802 may sense specific wavelengths of radiation.

Figure 9A:
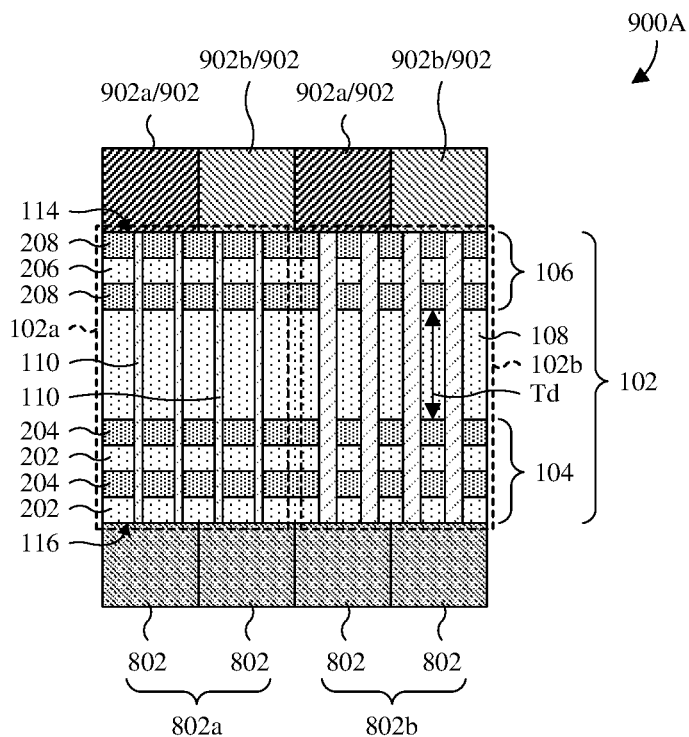
FIGS. 9A and 9B illustrate cross-sectional views of various embodiments of the integrated chip of FIG. 8 in which the integrated chip comprises absorptive color filters.

With reference to FIG. 9A, a cross-sectional view 900A of some alternative embodiments of the integrated chip of FIG. 8 is provided in which absorptive color filters 902 overly the narrow band filter 102. For example, first absorptive color filters 902a and second absorptive color filters 902b may be arranged over the narrow band filter 102 in an alternating pattern. The absorptive color filters 902 selectively pass corresponding wavelengths of radiation while absorbing or otherwise blocking other wavelengths of radiation. For example, the first absorptive color filters 902a may selectively pass first wavelengths of radiation (e.g., green wavelengths and/or other suitable other wavelengths) while blocking other wavelengths of radiation (blue wavelengths and/or other suitable wavelengths). As another example, the second absorptive color filters 902b may selectively pass second wavelengths of radiation (e.g., blue wavelengths and/or other suitable other wavelengths) while blocking other wavelengths of radiation (green wavelengths and/or other suitable wavelengths).

The absorptive color filters 902 aid in suppressing wavelengths of radiation outside the high transmission bands of the narrow band filter 102, so such wavelengths do not impinge on the photodetectors 802. Therefore, the photodetectors 802 more accurately sense radiation within the high transmission bands of the narrow band filter 102.

Further, the absorptive color filters 902 together with the narrow band filter 102 allow more filter spectrums to be created than there are columnar-structure fill factors. As mentioned above, the narrow band filter 102 may achieve multiple high transmission bands when the thickness Td of the defect layer 108 is large. Therefore, multiple high transmission bands may be created by the narrow band filter 102 for a given columnar-structure fill factor, and the multiple high transmission bands may be subsequently reduced by the absorptive color filters 902 to create multiple filter spectrums for the given columnar-structure fill factor. For example, supposing the narrow band filter 102 has a single columnar-structure fill factor and the thickness Td of the defect layer 108 is large to create four high transmission bands respectively at red, blue, and green wavelengths of radiation, red, blue, and green absorptive color filters 902 may be paired with these bands to create red, blue, and green filter spectrums without having to vary a fill factor of the columnar structure 110. In some embodiments, two of the four high transmission bands are at blue wavelengths of radiation, whereas the remaining high transmission bands are individually at red and green wavelengths of radiation.

Figure 9B:
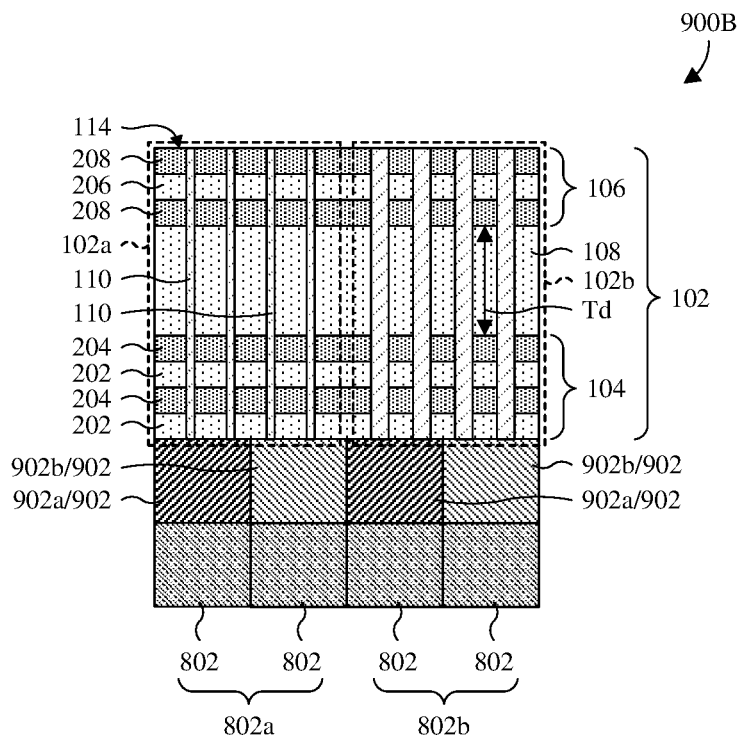

With reference to FIG. 9B, a cross-sectional view 900B of some alternative embodiments of the integrated chip of FIG. 9A is provided in which the absorptive color filters 902 are between the photodetectors 802 and the narrow band filter 102.

Figure 10A:
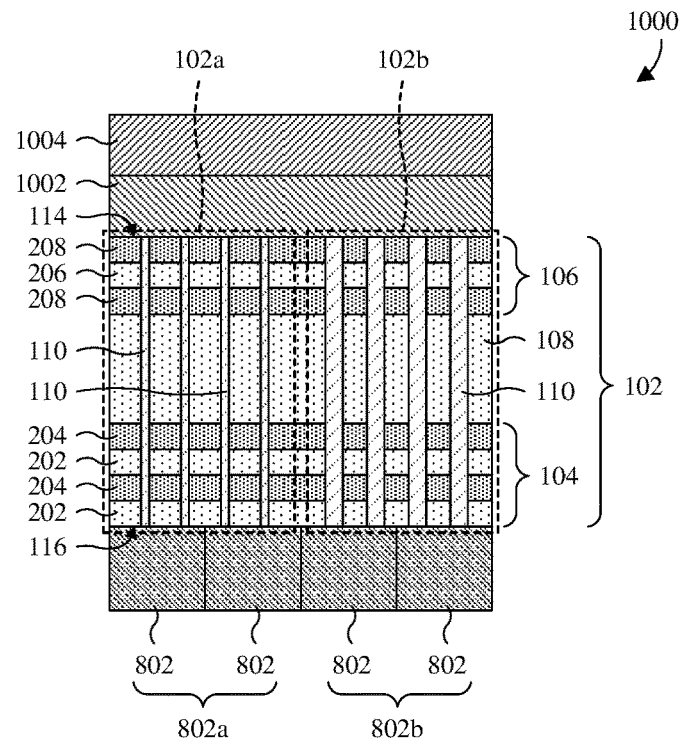
FIGS. 10A-10C illustrate cross-sectional views of various embodiments of the integrated chip of FIG. 8 in which the integrated chip comprises a low or high pass filter.

With reference to FIG. 10A, a cross-sectional view 1000A of some alternative embodiments of the integrated chip of FIG. 8 is provided in which a low pass filter 1002 and a high pass filter 1004 are stacked over the narrow band filter 102. As illustrated, the high pass filter 1004 overlies the low pass filter 1002. However, in other embodiments, the low pass filter 1002 may overlie the high pass filter 1004. The low pass filter 1002 passes wavelengths of radiation below an upper limit to the narrow band filter 102, while blocking wavelengths of radiation above the upper limit. The high pass filter 1004 passes wavelengths of radiation above a lower limit to the narrow band filter 102, while block wavelengths of radiation below the lower limit. The low and high pass filters 1002, 1004 aid in suppressing wavelengths of radiation outside the high transmission bands of the narrow band filter 102, so such wavelengths do not impinge on the photodetectors 802. Therefore, the photodetectors 802 more accurately sense radiation within the high transmission bands of the narrow band filter 102.

Figure 10B:
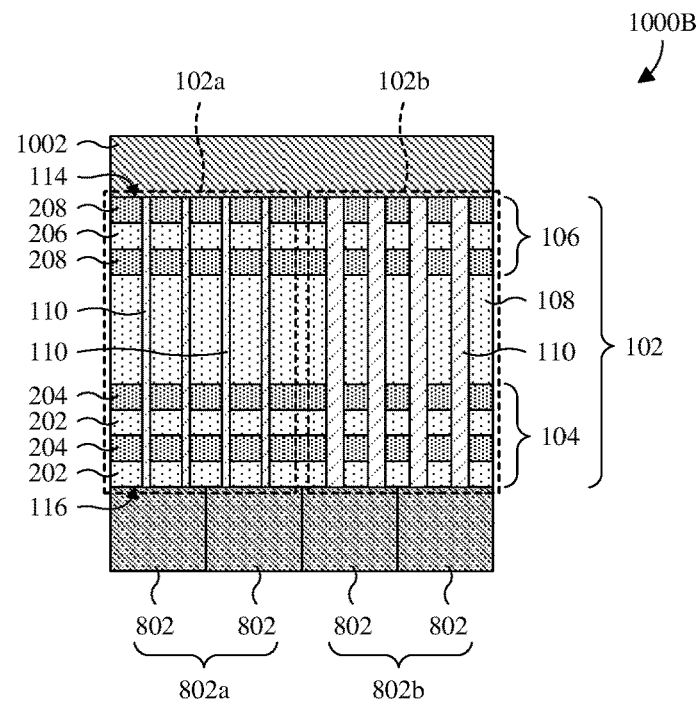
Figure 10C:
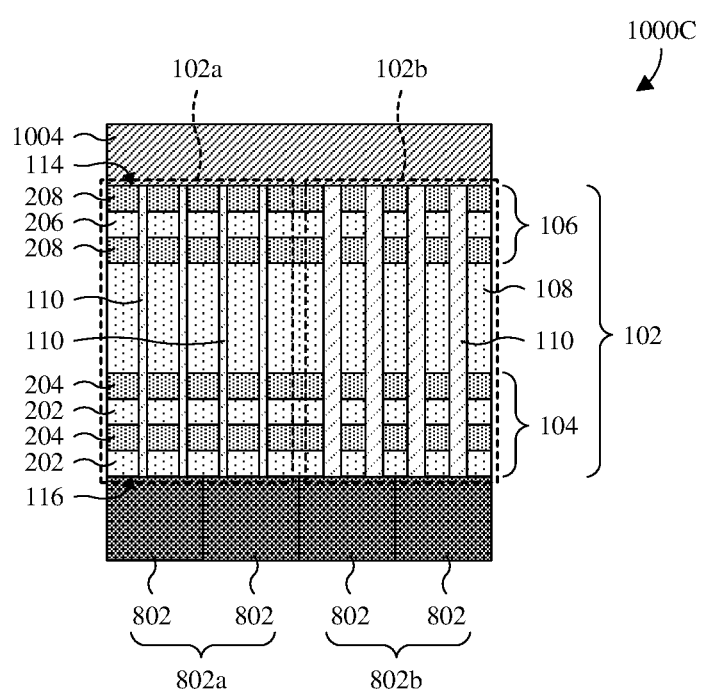

With reference to FIGS. 10B and 10C, cross-sectional views 1000B, 1000C of some alternative embodiments of the integrated chip of FIG. 10A are provided in which the high pass filter 1004 and the low pass filter 1002 are respectively omitted. In FIG. 10B, the high pass filter 1004 is omitted. In FIG. 10C, the low pass filter 1002 is omitted.

While FIGS. 8, 9A, 9B, and 10A-10C are illustrated using embodiments of the narrow band filter 102 in FIG. 3A, embodiments of the narrow band filter 102 in any one of FIGS. 1, 2A-2E, 3B-3E, 5A-5D, 6A, and 6B may be used in other embodiments. While FIGS. 10A-10C are illustrated using embodiments of the integrated chip in FIG. 8, embodiments of the integrated chip in any one of FIGS. 9A and 9B may be used in other embodiments.

Figure 11A:
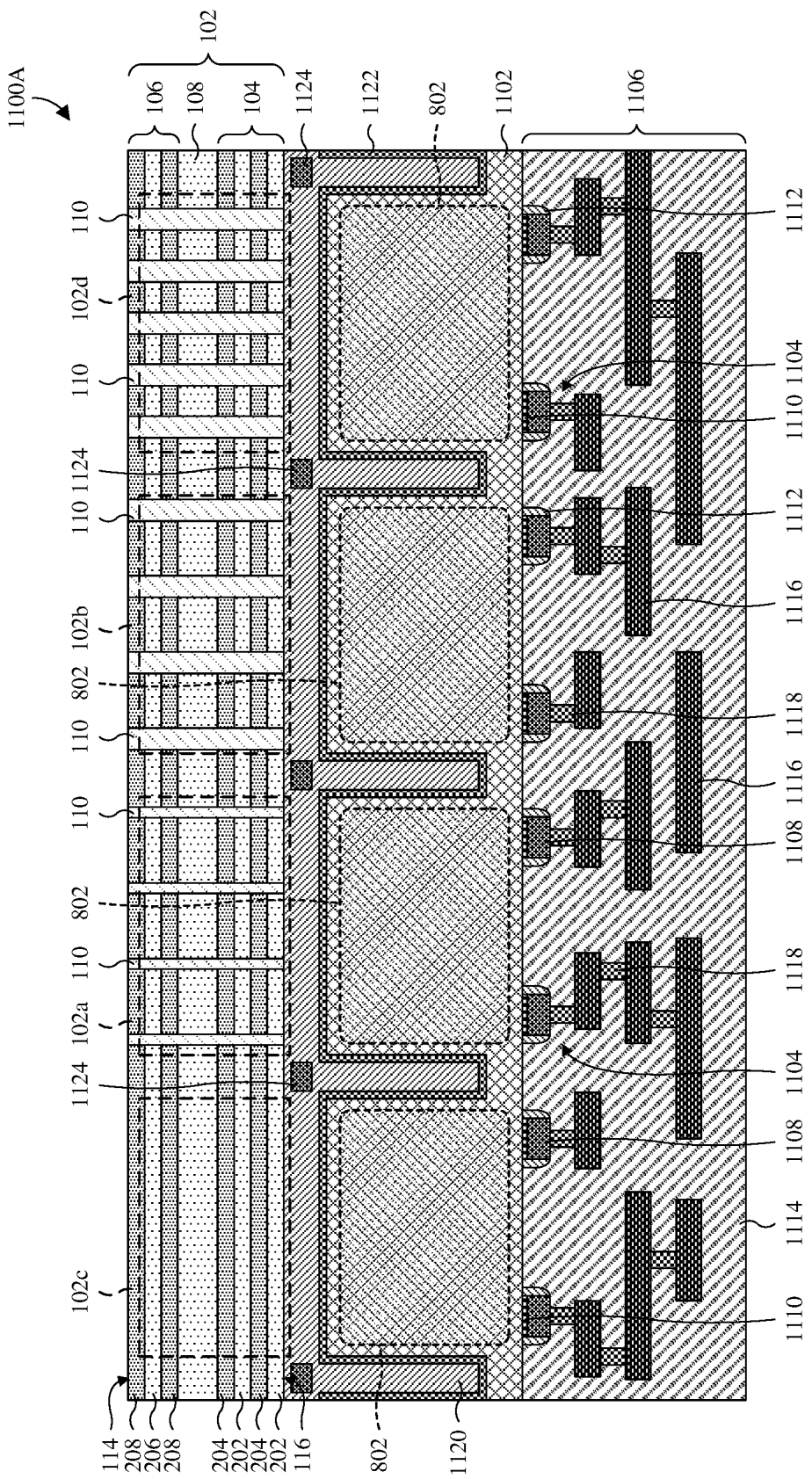
FIGS. 11A-11D illustrate cross-sectional views of various embodiments of the integrated chip of FIG. 8 in which the narrow band filter has additional regions respectively having different fill factors for the columnar structures.

With reference to FIG. 11A, a cross-sectional view 1100A of some more detailed embodiments of the integrated chip of FIG. 8 is provided in which the narrow band filter 102 additionally has a third region 102c and a fourth region 102d respectively having different fill factors for the columnar structures 110. At the third region 102c of the narrow band filter 102, the fill factor of the columnar structures 110 is zero. In other words, the columnar structures 110 are not present in the third region 102c of the narrow band filter 102. At the fourth region 102d of the narrow band filter 102, the fill factor of the columnar structures 110 is greater than at the first and second regions 102a, 102b of the narrow band filter 102. Because of the different fill factors, the high transmission band of the narrow band filter 102 is different at each of the first, second, third, and fourth regions 102a, 102b, 102c, 102d.

In some embodiments, the first, second, third, and fourth regions 102a, 102b, 102c, 102d define the colors of corresponding pixels in the integrated chip. As discussed above, the photodetectors 802 are unable to discriminate between different wavelengths of radiation and are hence color blind. However, by associating the photodetectors 802 with the first, second, third, and fourth regions 102a, 102b, 102c, 102d, radiation received by the photodetectors 802 is filtered by the associated regions of the narrow band filter 102 to only include the radiation transmitted by the associated regions. Therefore, the photodetectors 802 may respectively sense the different colors of the associated regions and the pixels to which the photodetectors 802 belong may have individual color assignments. In some embodiments, the first region 102a may correspond to a white pixel, the second region 102b may correspond to a red pixel, the third region 102c may correspond to a green pixel, and the fourth region 102d may correspond to a blue pixel. In other embodiments, the first region 102a may correspond to a white pixel, the second region 102b may correspond to a blue pixel, the third region 102c may correspond to a green pixel, and the fourth region 102d may correspond to a red pixel. Other correspondences are, however, amenable.

The narrow band filter 102 is on an upper side (or backside) of a semiconductor substrate 1102, and semiconductor devices 1104 and an interconnect structure 1106 are on an underside (or frontside) of the semiconductor substrate 1102. For ease of illustration, only some of the semiconductor devices 1104 are labeled 1104. Further, the photodetectors 802 are in the semiconductor substrate 1102 and each underlies an individual one of the first, second, third, and fourth regions 102a, 102b, 102c, 102d. As above, the photodetectors 802 may be or comprise, for example, photodiodes or some other suitable photodetectors. The semiconductor substrate 1102 may be, for example, a bulk silicon substrate, some other suitable bulk semiconductor substrate, a silicon-on-insulator (SOI) substrate, or some other suitable semiconductor substrate.

The semiconductor devices 1104 are partially defined by the semiconductor substrate 1102 and may be, for example, metal-oxide-semiconductor field-effect devices (MOSFETs), some other suitable metal-oxide-semiconductor (MOS) devices, other suitable insulated-gate field-effect transistors (IGFETs), other suitable semiconductor devices, or any combination of the foregoing. In some embodiments, the semiconductor devices 1104 and the photodetectors 802 collectively define pixel sensors individual to the first, second, third, and fourth regions 102a, 102b, 102c, 102d of the narrow band filter 102. The pixel sensors may, for example, be active pixel sensors or some other suitable pixel sensors. In some embodiments, the semiconductor devices 1104 comprise corresponding gate electrodes 1108, corresponding gate dielectric layers 1110, corresponding sidewall spacers 1112, corresponding source/drain regions (not shown), and corresponding selectively-conductive channels (not shown). For ease of illustration, only some of the gate electrodes 1108 are labeled 1108, only some of the gate dielectric layers 1110 are labeled 1110, and only some of the sidewall spacers 1112 are labeled 1112.

The source/drain regions and the selectively-conductive channels are in the semiconductor substrate 1102, and the gate electrodes 1108 respectively underlie the selectively-conductive channels. The gate dielectric layers 1110 space the gate electrodes 1108 from the semiconductor substrate 1102 and hence the selectively-conductive channels. The sidewall spacers 1112 are on sidewalls of the gate electrodes 1108. The gate electrodes 1108 may be or comprise, for example, doped polysilicon, metal, some other suitable conductive material(s), or any combination of the foregoing. The gate dielectric layers 1110 may be or comprise, for example, silicon oxide, some other suitable dielectric(s), or any combination of the foregoing. The sidewall spacers 1112 may be or comprise, for example, silicon oxide, silicon nitride, silicon oxynitride, some other suitable dielectric(s), or any combination of the foregoing.

The interconnect structure 1106 comprises an interconnect dielectric layer 1114, a plurality of wires 1116, and a plurality of vias 1118. For ease of illustration, only some of the wires 1116 are labeled 1116 and only some of the vias 1118 are labeled 1118. The wires 1116 and the vias 1118 are alternatingly stacked in the interconnect dielectric layer 1114 to define conductive paths to the semiconductor devices 1104. The conductive paths may, for example, interconnect the semiconductor devices 1104 and/or provide electrically coupling to the semiconductor devices 1104 from outside the integrated chip. The interconnect dielectric layer 1114 may be or comprise, for example, a low κ dielectric, silicon oxide, some other dielectric(s), or any combination of the foregoing. As used herein, a low κ dielectric may be or comprise, for example, a dielectric with a dielectric constant κ less than about 3.9, 3, 2, or 1. The wires 1116 and the vias 1118 may be or comprise, for example, copper, aluminum, aluminum copper, tungsten, some other suitable conductive material(s), or any combination of the foregoing.

In some embodiments, an isolation layer 1120 covers the semiconductor substrate 1102 and protrudes into the upper (or back) side of the semiconductor substrate 1102 to physically and electrically separate the photodetectors 802. The isolation layer 1120 may be or comprise, for example, silicon oxide, some other suitable dielectric(s), an antireflective coating (ARC), or any combination of the foregoing. In some embodiments, an isolation liner 1122 lines the upper (or back) side of the semiconductor substrate 1102 and separates the isolation layer 1120 from the semiconductor substrate 1102. The isolation liner 1122 may be or comprise, for example, silicon oxide and/or some other suitable dielectric(s). In some embodiments, a metal grid 1124 is in the isolation layer 1120 to act as guide for radiation passing through narrow band filter 102 to the photodetectors 802. By acting as a radiation guide, the metal grid 1124 may, for example, reduce cross talk between the photodetectors 802 and enhance quantum efficiency. The metal grid 1124 may be or comprise, for example, copper, aluminum copper, aluminum, some other suitable metal(s), or any combination of the foregoing.

Figure 11B:
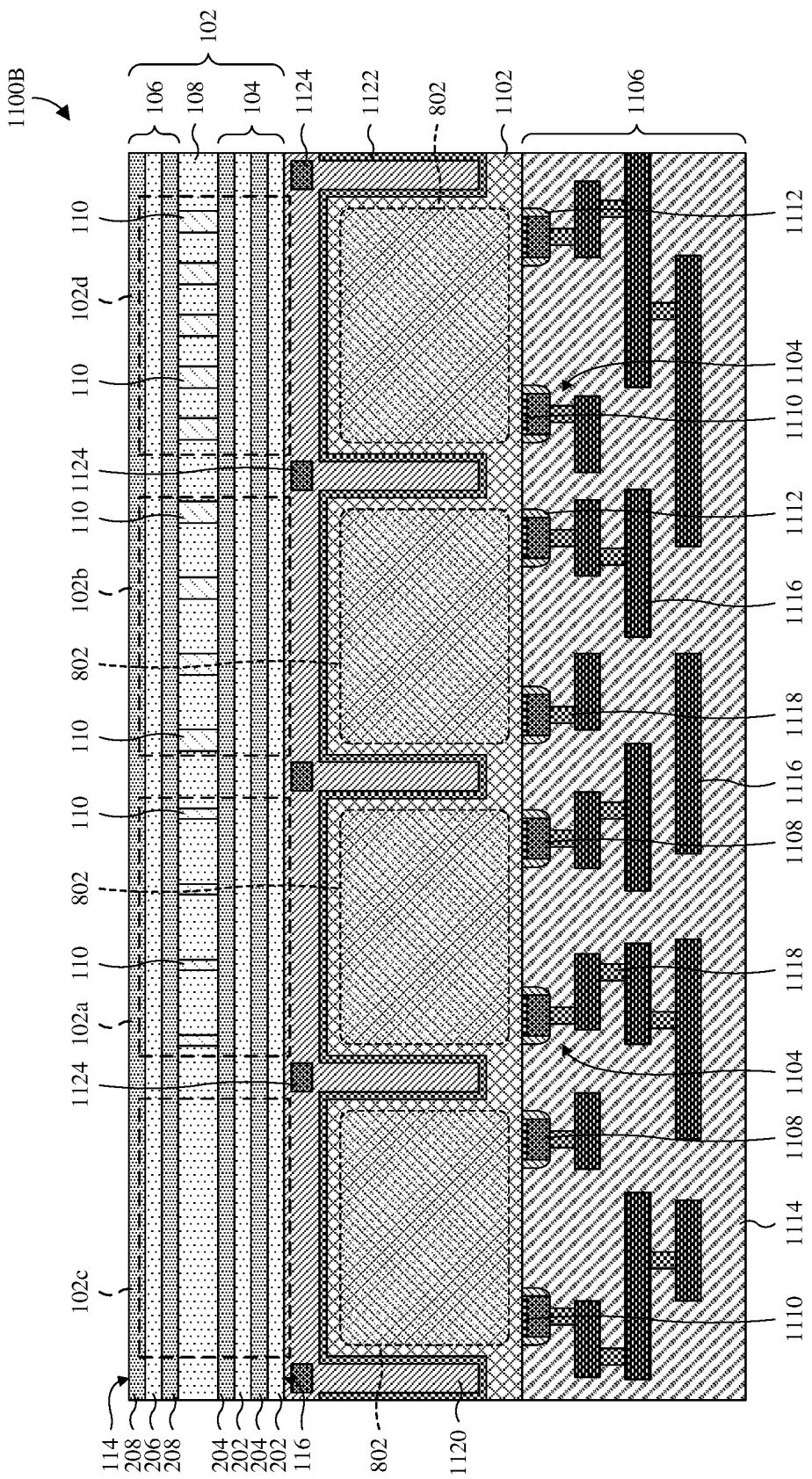

With reference to FIG. 11B, a cross-sectional view 1100B of some alternative embodiments of the integrated chip of FIG. 11A is provided in which the narrow band filter 102 uses the embodiments of FIG. 2A. As such, the columnar structures 110 are localized to the defect layer 108.

Figure 11C:
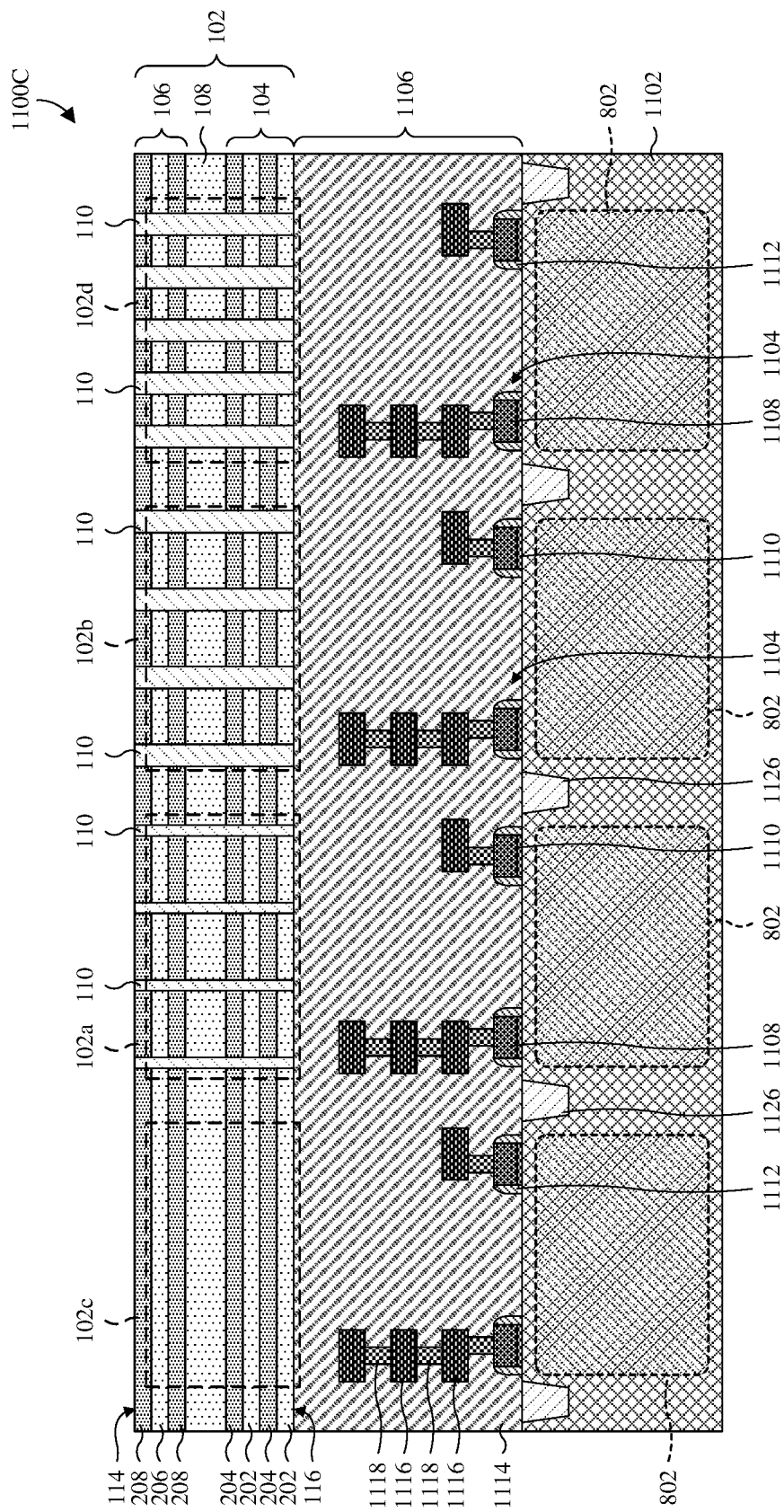

With reference to FIG. 11C, a cross-sectional view 1100C of some alternative embodiments of the integrated chip of FIG. 11A is provided in which the interconnect structure 1106 is between the semiconductor substrate 1102 and the narrow band filter 102. FIG. 11A may, for example, be regarded as a backside illuminated (BSI) image sensor, whereas FIG. 11C may, for example, be regarded as a frontside illuminated (FSI) image sensor. In some embodiments, isolation structures 1126 extend into the semiconductor substrate 1102, between the photodetectors 802. The isolation structures 1126 may, for example, provide physical and electrical separation between the photodetectors 802. Further, the isolation structures 1126 may be, for example, shallow trench isolation (STI) structures, deep trench isolation (DTI) structures, or some other suitable isolation structures.

Figure 11D:
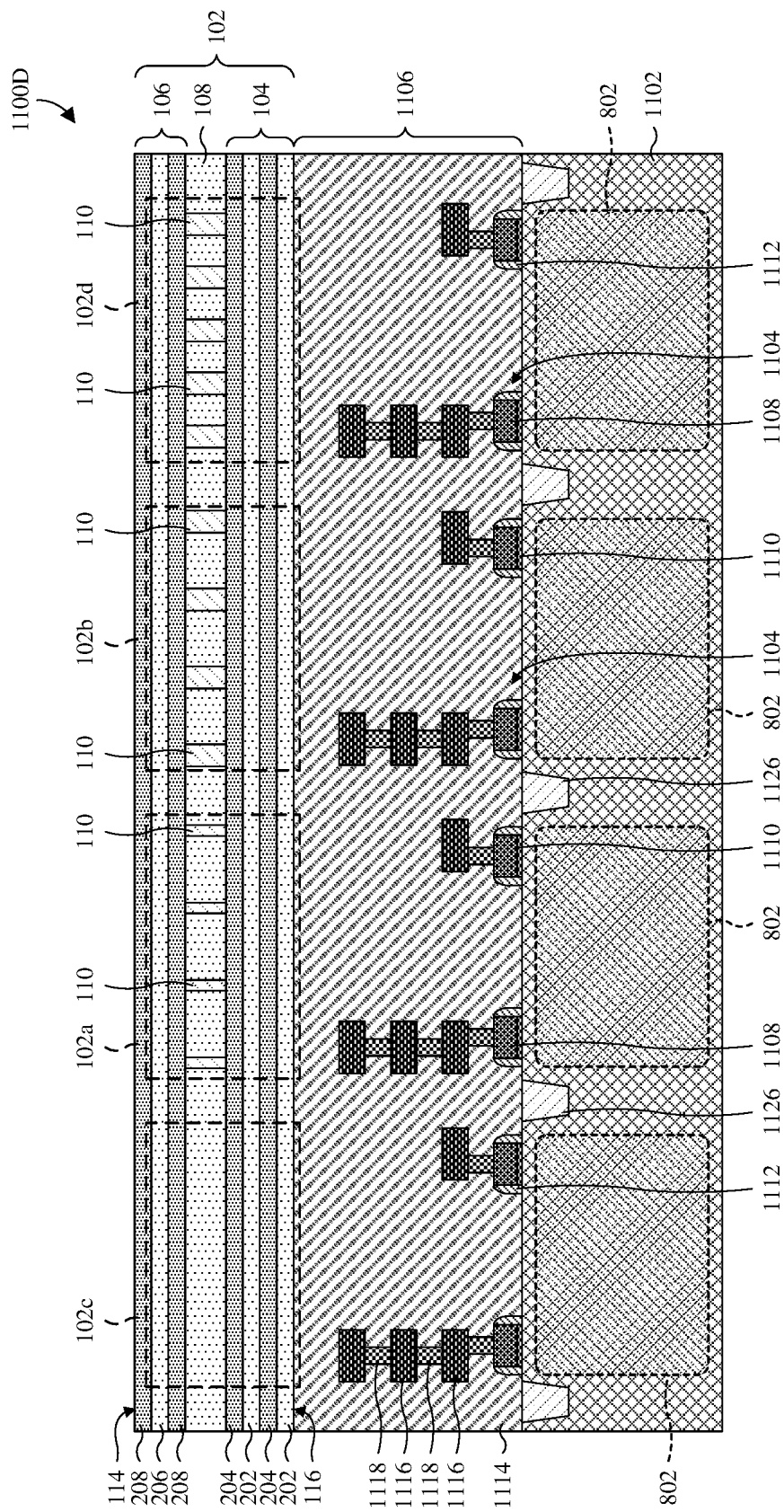

With reference to FIG. 11D, a cross-sectional view 1100D of some alternative embodiments of the integrated chip of FIG. 11C is provided in which the narrow band filter 102 uses the embodiments of FIG. 2A. As such, the columnar structures 110 are localized to the defect layer 108.

While FIGS. 11A-11D are illustrated using embodiments of the narrow band filter 102 in FIGS. 2A and 3A, embodiments of the narrow band filter 102 in any one of FIGS. 1, 2B-2E, 3B-3E, 5A-5D, 6A, and 6B may be used in other embodiments. Further, while FIGS. 11A-11D are illustrated without absorptive color filters, a low pass filter, and a high pass filter on the narrow band filter 102, it is to be appreciated that absorptive color filters, a low pass filter, a high pass filter, or any combination of the foregoing may be on the narrow band filter 102 as illustrated and described with regard to FIGS. 9A, 9B, and 10A-10C.

Figure 15:
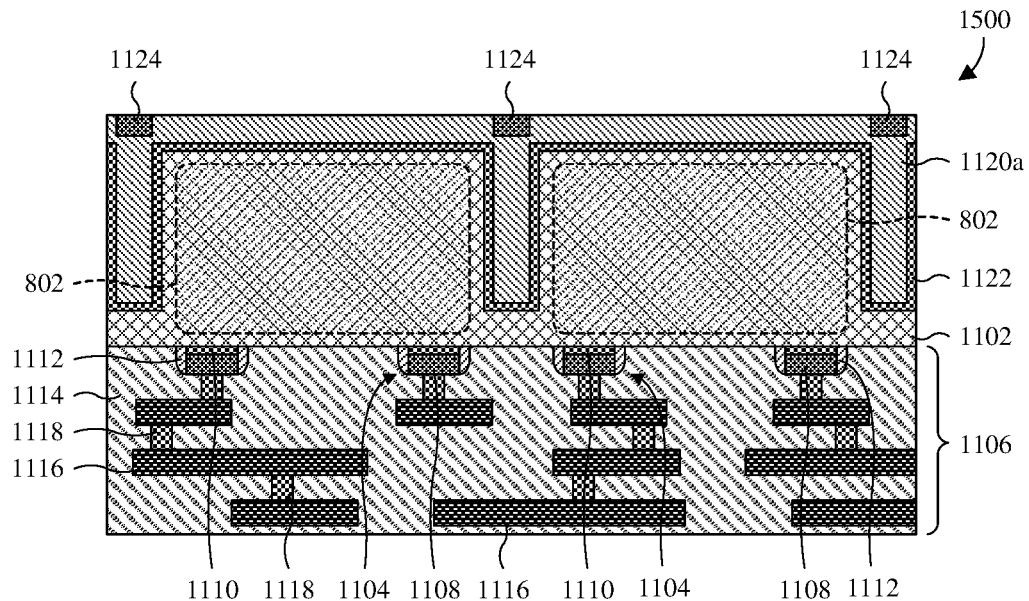
Figure 16A:
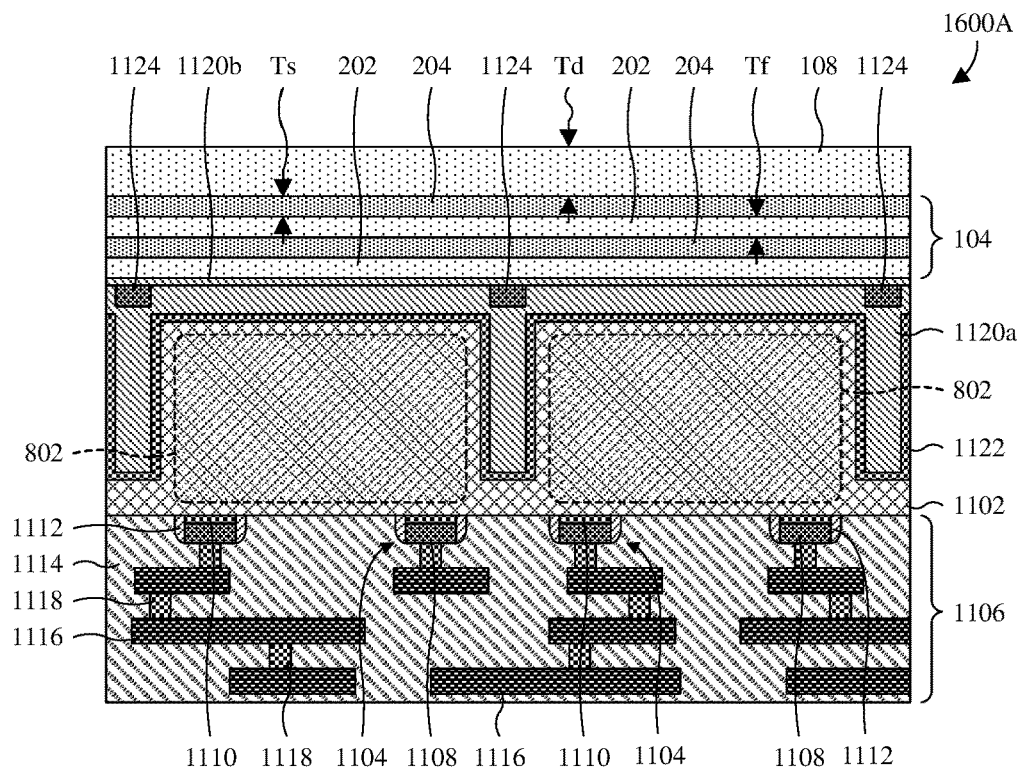
Figure 16B:
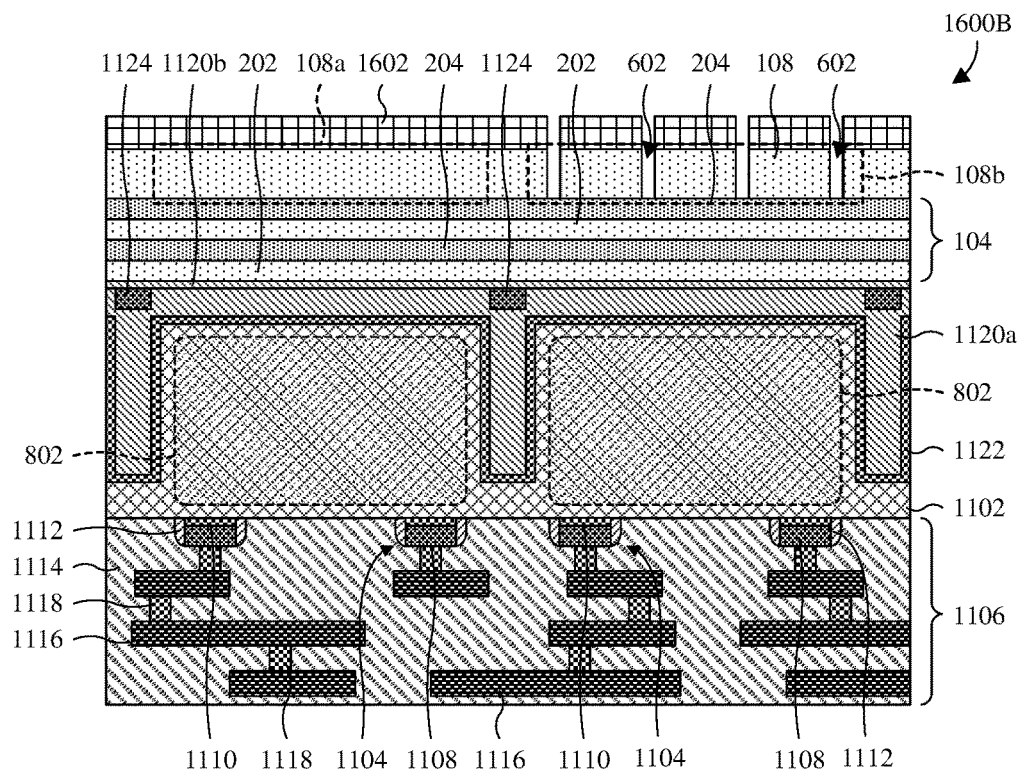
Figure 16C:
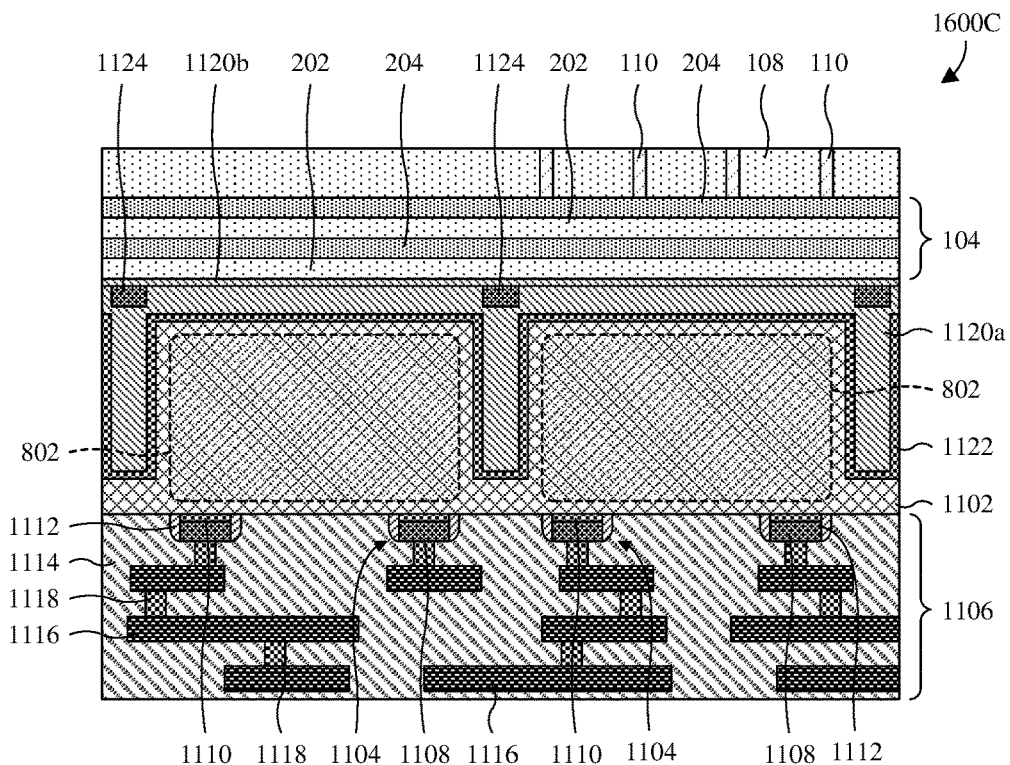
Figure 16D:
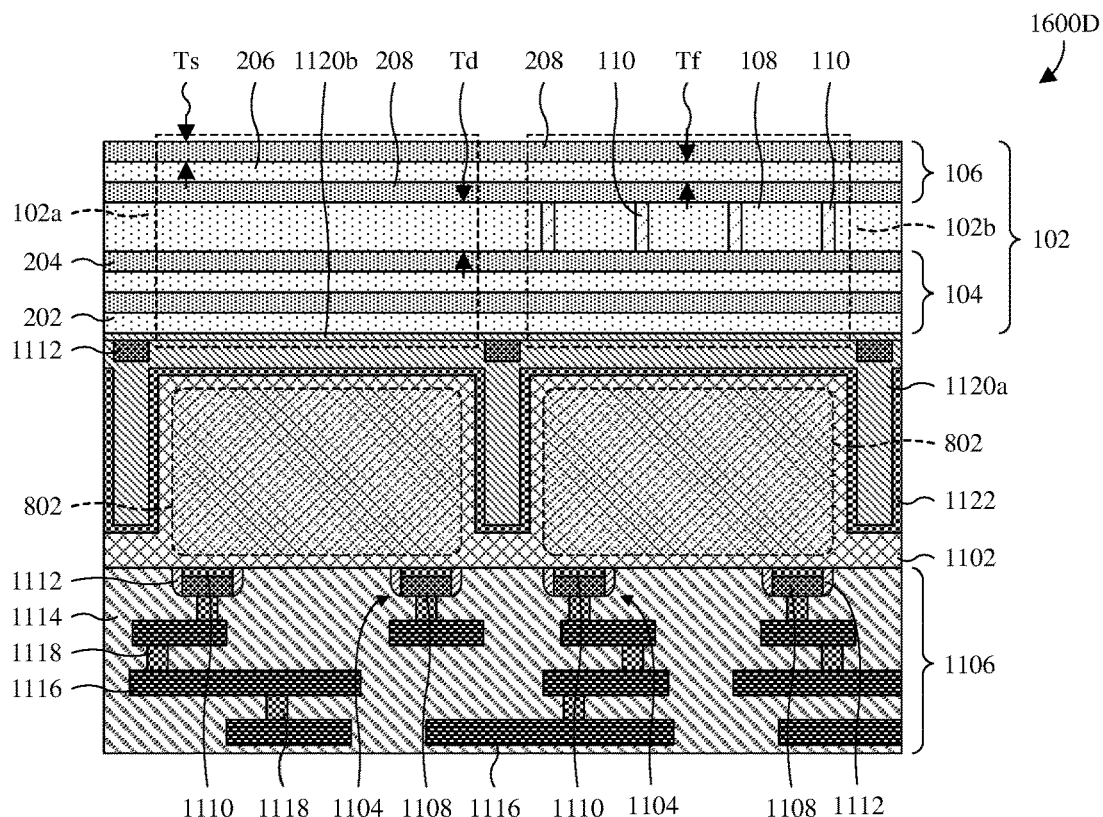
Figure 17A:
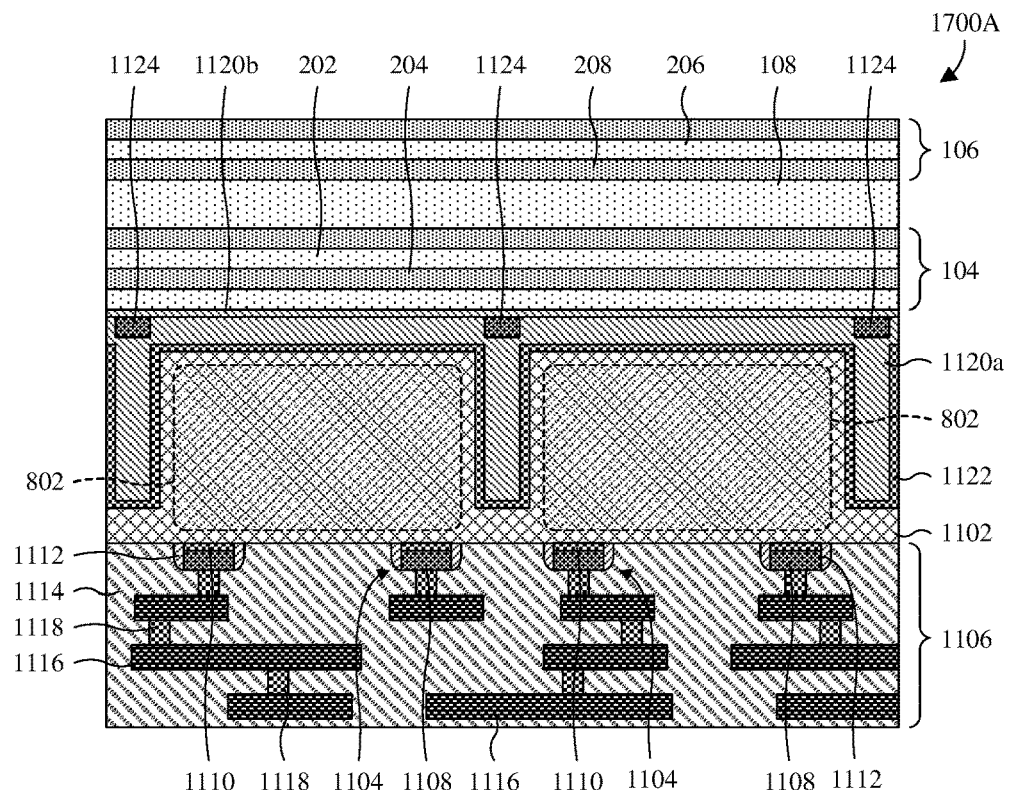
Figure 17B:
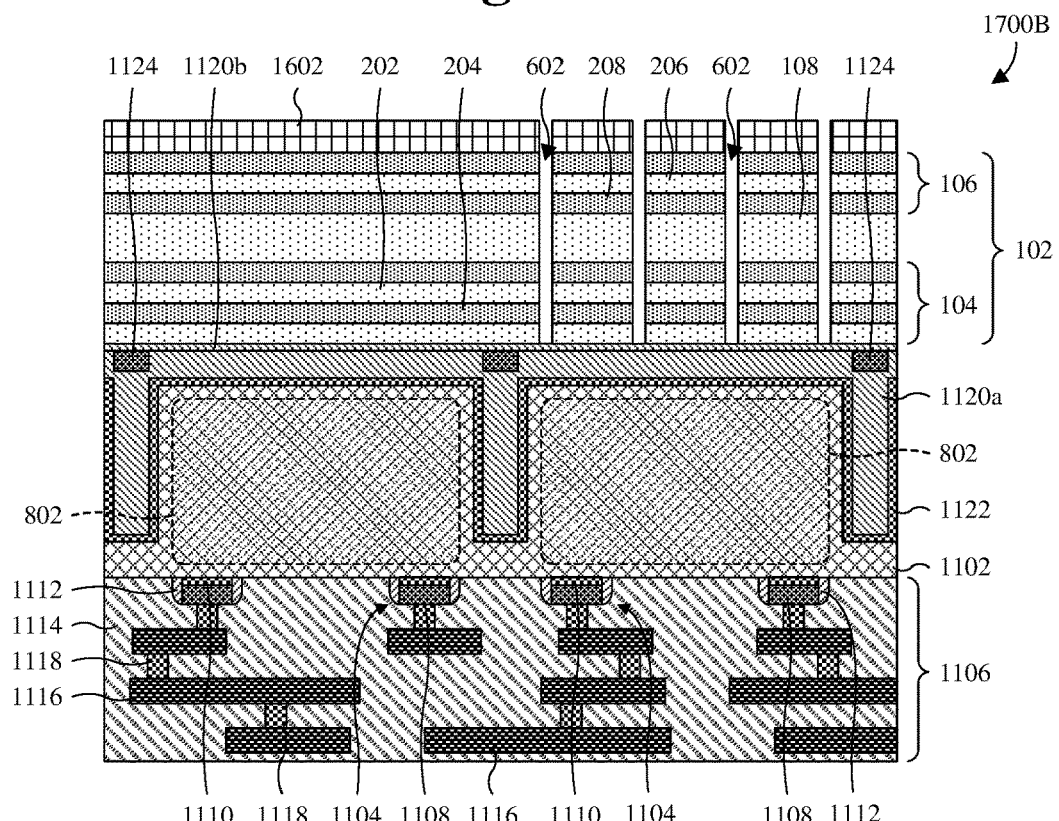
Figure 17C:
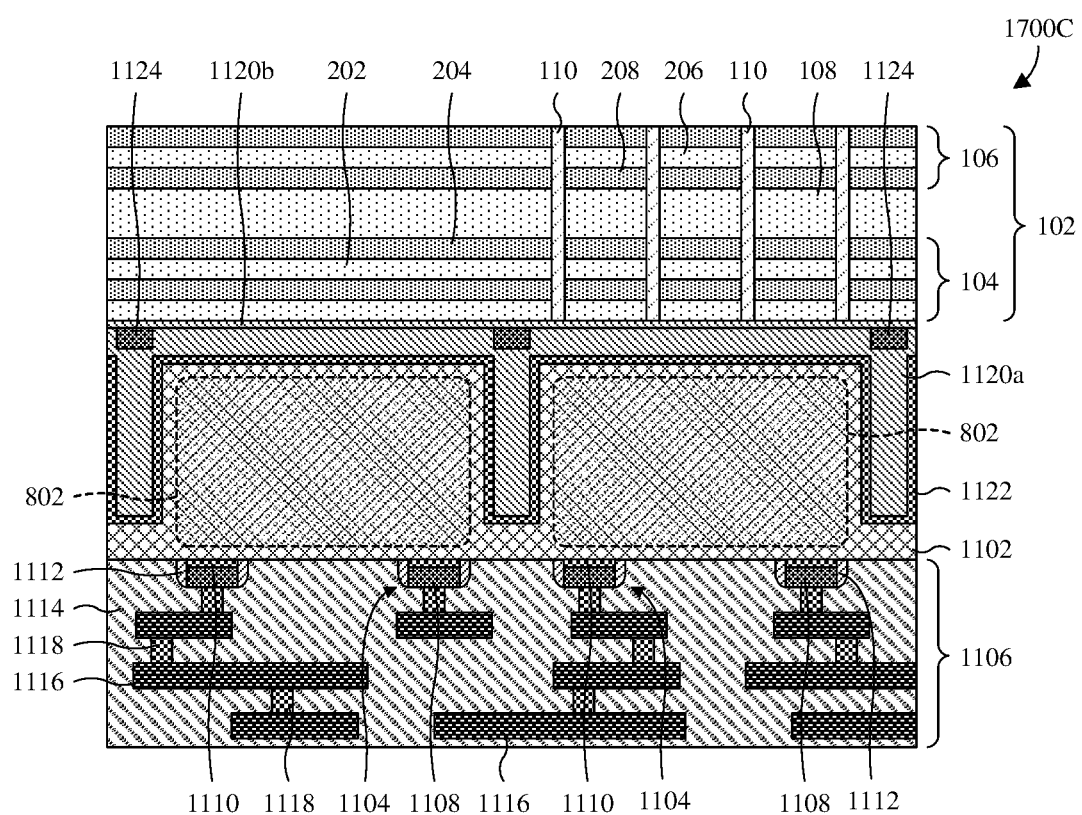

With reference to FIGS. 12-15, 16A-16D, and 17A-17C, a series of cross-sectional views 1200-1500, 1600A-1600D, 1700A-1700C of various embodiments of a method for forming a BSI integrated image chip comprising a narrow band filter with high transmission is provided. FIGS. 17A-17C are alternatives to FIGS. 16A-16D. As such, the method proceeds from FIGS. 12-15 to FIGS. 16A-16D in first embodiments, and proceeds from FIGS. 12-15 to FIGS. 17A-17C in second embodiments. The first embodiments may, for example, be performed to form embodiments of the narrow band filter in FIGS. 2A-2E. The second embodiments may, for example, be performed to form embodiments of the narrow band filter in FIGS. 3A-3E. While FIGS. 12-15, 16A-16D, and 17A-17C are described with reference to a method, it will be appreciated that the structures shown in FIGS. 12-15, 16A-16D, and 17A-17C are not limited to the method and may stand alone.

Figure 12:
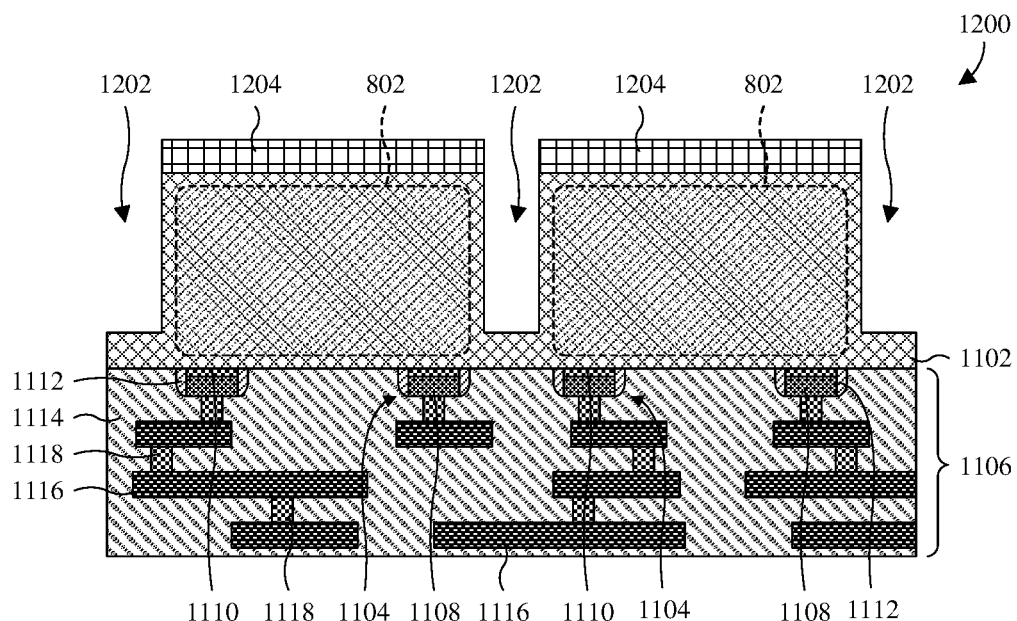
FIGS. 12-15, 16A-16D, and 17A-17C illustrate a series of cross-sectional views of various embodiments of a method for forming a backside illuminated (BSI) integrated image chip comprising a narrow band filter with high transmission.

As illustrated by the cross-sectional view 1200 of FIG. 12, photodetectors 802 are formed in a semiconductor substrate 1102. Further, semiconductor devices 1104 and an interconnect structure 1106 are formed on a frontside of the semiconductor substrate 1102. The photodetectors 802, the semiconductor substrate 1102, the semiconductor devices 1104, the interconnect structure 1106, or any combination of the foregoing may, for example, be as described with regard to FIGS. 11A-11D.

Also illustrated by the cross-sectional view 1200 of FIG. 12, a backside of the semiconductor substrate 1102 is patterned to form isolation trenches 1202 separating the photodetectors 802. The patterning may, for example, be performed by a photolithography/etching process, some other suitable patterning process(es), or any combination of the foregoing. The photolithography/etching process may, for example, comprise: forming a photoresist mask 1204 with a layout of the isolation trenches 1202 on the semiconductor substrate 1102; performing an etch into the semiconductor substrate 1102 with the photoresist mask 1204 in place; and removing the photoresist mask 1204.

Figure 13:
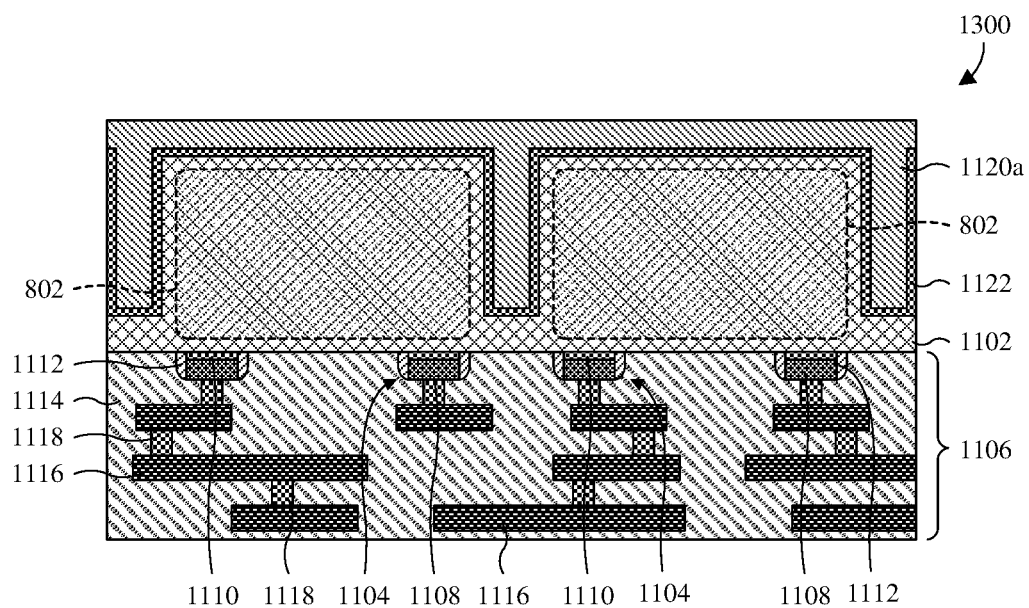

As illustrated by the cross-sectional view 1300 of FIG. 13, an isolation liner 1122 is formed covering the semiconductor substrate 1102 and lining the isolation trenches 1202 (see FIG. 12). In alternative embodiments of the method, the isolation liner 1122 is not formed. The isolation liner 1122 may be or comprise, for example, silicon oxide and/or some other suitable dielectric(s). Further, the isolation liner 1122 may, for example, be formed by chemical vapor deposition (CVD), physical vapor deposition (PVD), thermal oxidation, some other suitable deposition process(es), or any combination of the foregoing.

Also illustrated by the cross-sectional view 1300 of FIG. 13, a first isolation layer 1120a is deposited on the semiconductor substrate 1102 and filling the isolation trenches 1202 (see FIG. 12). The first isolation layer 1120a is dielectric and may be or comprise, for example, an ARC, an organic material, some other suitable material, or any combination of the foregoing. The first isolation layer 1120a may, for example, be deposited by CVD, PVD, sputtering, spin coating, some other suitable deposition process(es), or any combination of the foregoing. In some embodiments, the first isolation layer 1120a is self-leveling, such that an upper or top surface of the first isolation layer 1120a flattens from the force of gravity. In other embodiments, a planarization is performed into the upper or top surface of the first isolation layer 1120a to flatten the upper or top surface. The planarization may, for example, be performed by a chemical mechanical polish (CMP) and/or some other suitable planarization process(es).

Figure 14:
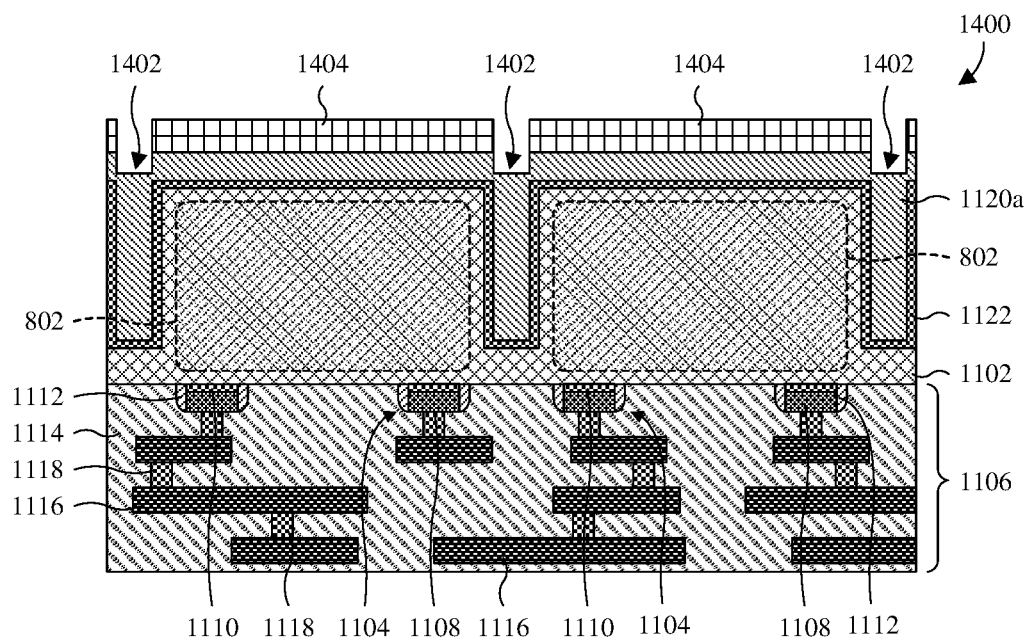

As illustrated by the cross-sectional view 1400 of FIG. 14, the first isolation layer 1120a is patterned to define grid trenches 1402 with a grid pattern that extends between the photodetectors 802. The patterning may, for example, be performed by a photolithography/etching process, some other suitable patterning process(es), or any combination of the foregoing. The photolithography/etching process may, for example, comprise: forming a photoresist mask 1404 with a layout of the grid trenches 1402 on the first isolation layer 1120a; performing an etch into the first isolation layer 1120a with the photoresist mask 1404 in place; and removing the photoresist mask 1404.

As illustrated by the cross-sectional view 1500 of FIG. 15, a metal grid 1124 is formed in the grid trenches 1402 (see FIG. 14). The metal grid 1124 blocks radiation from passing between the photodetectors 802 to reduce cross talk and improve quantum efficiency. The metal grid 1124 may be or comprise, for example, copper, aluminum, some other suitable metal(s), or any combination of the foregoing. The metal grid 1124 may, for example, be formed by depositing a metal layer covering the first isolation layer 1120a and filling the grid trenches 1402, and subsequently performing a planarization into the metal layer until the first isolation layer 1120a is reached. The depositing may, for example, be performed by CVD, PVD, sputtering, electroplating, electroless plating, some other suitable deposition process(es), or any combination of the foregoing. The planarization may, for example, be performed by CMP and/or some other suitable planarization process(es).

As illustrated by the cross-sectional view 1600A of FIG. 16A, a second isolation layer 1120b is deposited on the metal grid 1124 and the first isolation layer 1120a. The second isolation layer 1120b is dielectric and may be or comprise, for example, an ARC, an organic material, some other suitable material, or any combination of the foregoing. The second isolation layer 1120b may, for example, be deposited by CVD, PVD, sputtering, spin coating, some other suitable deposition process(es), or any combination of the foregoing.

Also illustrated by the cross-sectional view 1600A of FIG. 16A, a first multilayer film 104 is formed on the second isolation layer 1120b. The first multilayer film 104 alternates between a first refractive index and a second refractive index from top to bottom. In some embodiments, the first multilayer film 104 is or defines a DBR. The first multilayer film 104 comprises one or more first layers 202 and one or more second layers 204.

The first layer(s) 202 are alternatingly stacked with the second layer(s) 204. The first layer(s) 202 each individually has: 1) the first refractive index; 2) the same thickness Tf as each other one of the first layer(s) 202; 3) the same material composition as each other one of the first layer(s) 202; 4) or any combination of the foregoing. The second layer(s) 204 each individually has: 1) the second refractive index; 2) the same thickness Ts as each other one of the second layer(s) 204; 3) the same composition as each other one of the second layer(s) 204; 4) or any combination of the foregoing. The first refractive index may, for example, be about 1.0-1.5, and the second refractive index may, for example, be about 1.7-4.5, or vice versa. Other values are, however, amenable. Further, the first refractive index may, for example, larger than the second refractive index or vice versa. The first and second layers 202, 204 may, for example, be or comprise low absorption materials for wavelengths to be transmitted, transparent materials, dielectric materials, or any combination of the foregoing. In some embodiments, the first layer(s) 202 are or comprise silicon dioxide, whereas the second layer(s) 204 are or comprise titanium oxide, or vice versa. Other materials are, however, amenable.

The first multilayer film 104 may, for example, be formed by alternatingly depositing a first layer 202 and a second layer 204. The depositing may, for example, be performed by CVD, PVD, sputtering, oxidation, some other suitable deposition process(es), or any combination of the foregoing.

Also illustrated by the cross-sectional view 1600A of FIG. 16A, a defect layer 108 is deposited on the first multilayer film 104. In some embodiments, the defect layer 108 has a different refractive index than the first and second refractive indexes of the first multilayer film 104. In some embodiments, a thickness Td of the defect layer 108 is different than the thickness Tf of the first layer(s) 202. In some of such embodiments, the defect layer 108 has the first refractive index, adjoins one of the second layer(s) 204, has the same material composition as the first layer(s) 202, or any combination of the foregoing. In some embodiments, the thickness Td of the defect layer 108 is different than the thickness Ts of the second layer(s) 204. In some of such embodiments, the defect layer 108 has the second refractive index, adjoins one of the first layer(s) 202, has the same material composition as the second layer(s) 204, or any combination of the foregoing. In some embodiments, the thickness Td of the defect layer 108 is between about 30-600 nanometers in such embodiments. Other thicknesses are, however, amenable for the defect layer 108. In some embodiments, the defect layer 108 is or comprises silicon oxide, titanium oxide, some other suitable material(s), or any combination of the foregoing. The defect layer 108 may, for example, be formed by CVD, PVD, sputtering, oxidation, some other suitable deposition process(es), or any combination of the foregoing.

As illustrated by the cross-sectional view 1600B of FIG. 16B, the defect layer 108 is patterned to form a plurality of columnar cavities 602 arranged in one or more periodic patterns. For ease of illustration, only some of the columnar cavities 602 are labeled 602. As seen hereafter, the high transmission band of the narrow band filter being formed shifts based upon the fill factor of the columnar cavities 602. In some embodiments, the fill factor of the columnar cavities 602 varies between regions of the defect layer 108. For example, the columnar cavities 602 may have a first fill factor at a first region 108a of the defect layer 108 overlying one of the photodetectors 802 and a second, different fill factor at a second region 108b of the defect layer 108 overlying another one of the photodetectors 802. The top layout of the columnar structures 110 at each region of the defect layer 108 may, for example, be as illustrated in any one of FIGS. 7A-7G.

The patterning may, for example, be performed by a photolithography/etching process, a drilling process, some other suitable patterning process(es), or any combination of the foregoing. The photolithography/etching process may, for example, comprise: forming a photoresist mask 1602 with a layout of the columnar cavities 602 on the defect layer 108; performing an etch into the defect layer 108 with the photoresist mask 1602 in place; and removing the photoresist mask 1602. The photoresist mask 1602 may, for example, be formed with a single photomask or photo reticle and may be used to form the columnar cavities 602 with fill factors varying between multiple different regions of the defect layer 108.

As illustrated by the cross-sectional view 1600C of FIG. 16C, columnar structures 110 are formed in the columnar cavities 602 (see FIG. 16B). For ease of illustration, only some of the columnar structures 110 are labeled 110. In alternative embodiments, the columnar structures 110 are not formed and the columnar cavities 602 remain unfilled to conclusion of the method. The columnar structures 110 have refractive indexes different (e.g., lower or higher) than those of the defect layer 108 and the first and second layers 202, 204. In some embodiments, the columnar structures 110 each individually has a refractive index that is the same as each other one of the columnar structures 110 and/or each has the same material composition as each other one of the columnar structures 110. The columnar structures 110 may be or comprise, for example, low absorption materials for wavelengths to be transmitted, transparent materials, dielectric materials, or any combination of the foregoing. The columnar structures 110 may, for example, be formed by depositing a layer covering the defect layer 108 and filling the columnar cavities 602, and subsequently performing a planarization into the layer until the defect layer 108 is reached. The depositing may, for example, be performed by CVD, PVD, sputtering, some other suitable deposition process(es), or any combination of the foregoing. The planarization may, for example, be performed by CMP and/or some other suitable planarization process(es).

As illustrated by the cross-sectional view 1600D of FIG. 16D, a second multilayer film 106 is formed on the defect layer 108 and the columnar structures 110. The second multilayer film 106 alternates between the first refractive index of the first multilayer film 104 and the second refractive index of the first multilayer film 104 from top to bottom. In some embodiments, the second multilayer film 106 is or defines a DBR. The second multilayer film 106 comprises one or more third layers 206 and one or more fourth layers 208.

The third layer(s) 206 are alternatingly stacked with the fourth layer(s) 208. The third layer(s) 206 each individually has: 1) the first refractive index; 2) the same thickness Tf as each other one of the first and/or third layer(s) 206; 3) the same material composition as each other one of the first and/or third layer(s) 202, 206; 4) or any combination of the foregoing. The fourth layer(s) 208 each individually has: 1) the second refractive index; 2) the same thickness Ts as each other one of the second and/or fourth layer(s) 204, 208; 3) the same composition as each other one of the second and/or fourth layer(s) 204, 208; 4) or any combination of the foregoing. The third and fourth layers 206, 208 may, for example, be or comprise low absorption materials for wavelengths to be transmitted, clear materials, dielectric materials, or any combination of the foregoing. In some embodiments, the third layer(s) 206 are or comprise silicon dioxide, whereas the fourth layer(s) 208 are or comprise titanium oxide, or vice versa. Other materials are, however, amenable.

The second multilayer film 106 may, for example, be formed by alternatingly depositing a third layer 206 and the fourth layer 208. The depositing may, for example, be performed by CVD, PVD, sputtering, oxidation, some other suitable deposition process(es), or any combination of the foregoing.

Collectively, the first and second multilayer films 104, 106, the defect layer 108, and the columnar structures 110 define the narrow band filter 102. The first and second multilayer films 104, 106 define a low transmission band (i.e., a range of wavelengths) at which transmission is low. The defect layer 108 defines a high transmission band (i.e., a range of wavelengths) at which transmission is high. The high transmission band is narrow and divides the low transmission band into segments, between lower and upper limits of the low transmission band. The columnar structures 110 shift the location of the high transmission band based on the refractive index of the columnar structures 110 and a fill factor of the columnar structures 110. The fill factor may, for example, be varied by changing the size of the columnar structures 110, spacing between the columnar structures 110, the shape of the columnar structure 110, some other property of the columnar structures 110, or any combination of the foregoing. When the columnar structures 110 have a refractive index less than the refractive indexes of the first and second multilayer films 104, 106, increasing the fill factor shifts the high transmission band to lower wavelengths and decreasing the fill factor shifts the high transmission band to higher wavelengths. When the columnar structures 110 have a refractive index more than the refractive indexes of the first and second multilayer films 104, 106, increasing the fill factor shifts the high transmission band to higher wavelengths and decreasing the fill factor shifts the high transmission band to lower wavelengths.

Because of the columnar structures 110, the location of the high transmission band may be controlled to a high degree. Further, because of the use of the defect layer 108 to create the high transmission band, the high transmission band may be narrow. Further yet, because the first and second multilayer films 104, 106 may be formed with transparent materials and/or materials with a low absorption for wavelengths to be transmitted by the narrow band filter 102, high transmissions may be achieved at the high transmission band.

By varying the fill factor of the columnar structures 110 at different regions of the narrow band filter 102, the location of the high transmission band can be varied at the different regions. For example, a first region 102a of the narrow band filter 102 may have a low or zero fill factor and a second region 102b of the narrow band filter 102 may have a comparatively high fill factor, whereby the high transmission band may be different between the first and second regions 102a, 102b. Further, as discussed with regard to FIG. 16B, the fill factor, and hence the high transmission bands, at different regions may be controlled by a single photomask or photo reticle, such that costs are low. For example, the narrow band filter 102 may be formed to selectively pass red, green, and blue wavelengths of radiation respectively at different regions of the narrow band filter 102 using a single photomask or photo reticle.

The foregoing embodiments of the method proceeded from FIGS. 12-15 to FIGS. 16A-16D. However, in alternative embodiments, the acts at FIGS. 17A-17C are performed in place of the acts at FIGS. 16A-16D, whereby the method proceeds from FIGS. 12-15 to FIGS. 17A-17C.

As illustrated by the cross-sectional view 1700A of FIG. 17A, the second isolation layer 1120*b*, the first multilayer film 104, the defect layer 108, and the second multilayer film 106 are formed stacked on the second isolation structure 1120*a* and the metal grid 1124. The second isolation layer 1120*b*, the first multilayer film 104, and the defect layer 108 may, for example, be formed as described with regard to FIG. 16A, and the second multilayer film 106 may, for example, be formed as described with regard to FIG. 16D.

As illustrated by the cross-sectional view 1700B of FIG. 17B, the first and second multilayer films 104, 106 and the defect layer 108 are patterned to form a plurality of columnar cavities 602 in one or more periodic patterns. For ease of illustration, only some of the columnar cavities 602 are labeled 602. The patterning may, for example, be performed as described with regard to FIG. 16B. For example, the patterning may be performed by a photolithography/etching process in which a single photomask or photo reticle is used to form the columnar cavities 602 with fill factors varying between multiple different regions of the defect layer 108.

As illustrated by the cross-sectional view 1700C of FIG. 17C, columnar structures 110 are formed in the columnar cavities 602 (see FIG. 17B). For ease of illustration, only some of the columnar structures 110 are labeled 110. In alternative embodiments, the columnar structures 110 are not formed and the columnar cavities 602 remain unfilled to conclusion of the method. The columnar structures 110 may, for example, be formed as described with regard to FIG. 16C.

Figure 18:
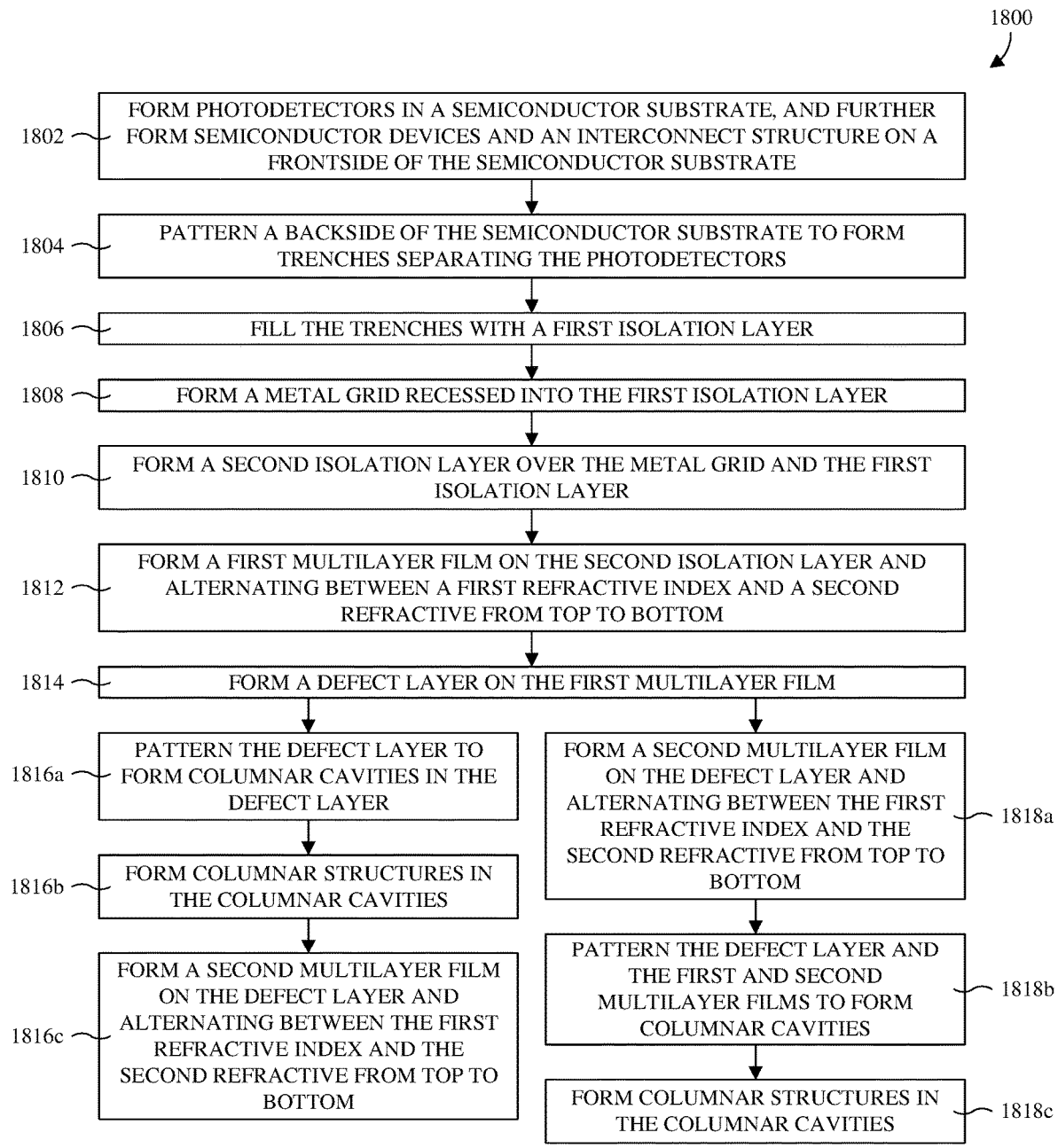
FIG. 18 illustrates a block diagram of some embodiments of the method of FIGS. 12-15, 16A-16D, and 17A-17C.

With reference to FIG. 18, a block diagram 1800 of some embodiments of the method of FIGS. 12-15, 16A-16D, and 17A-17C is provided.

At 1802, photodetectors are formed in a semiconductor substrate. Further, semiconductor devices and an interconnect structure are formed on a frontside of the semiconductor substrate. See, for example, FIG. 12.

At 1804, a backside of the semiconductor substrate is patterned to form trenches separating the photodetectors. See, for example, FIG. 12.

At 1806, the trenches are filled with a first isolation layer. See, for example, FIG. 13.

At 1808, a metal grid is formed recessed into the first isolation layer. See, for example, FIGS. 14 and 15.

At 1810, a second isolation layer is formed over the metal grid and the first isolation layer. See, for example, FIG. 16A or 17A

At 1812, a first multilayer film is formed on the second isolation layer and alternating between a first refractive index and a second refractive from top to bottom. See, for example, FIG. 16A or FIG. 17A. In alternative embodiments, the acts at 1804-1810 are omitted and the first multilayer film is instead formed on the interconnect structure.

At 1814, a defect layer is formed on the first multilayer film. See, for example, FIG. 16A or FIG. 17A.

In some first embodiments of the method, the method proceeds from 1814 to 1816*a*-1816*c*. At 1816*a*, the defect layer is patterned to form columnar cavities in the defect layer. See, for example, FIG. 16B. At 1816*b*, columnar structures are formed in the columnar cavities. See, for example, FIG. 16C. At 1816*c*, a second multilayer film is formed on the defect layer and alternating between the first refractive index and the second refractive from top to bottom. See, for example, FIG. 16D.

In some second embodiments of the method, the method proceeds from 1814 to 1818*a*-1818*c*. At 1818*a*, a second multilayer film is formed on the defect layer and alternating between the first refractive index and the second refractive from top to bottom. See, for example, FIG. 17A. At 1818*b*, the defect layer and the first and second multilayer films are patterned to form columnar cavities. See, for example, FIG. 17B. At 1818*c*, columnar structures are formed in the columnar cavities. See, for example, FIG. 17*c*.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 19:
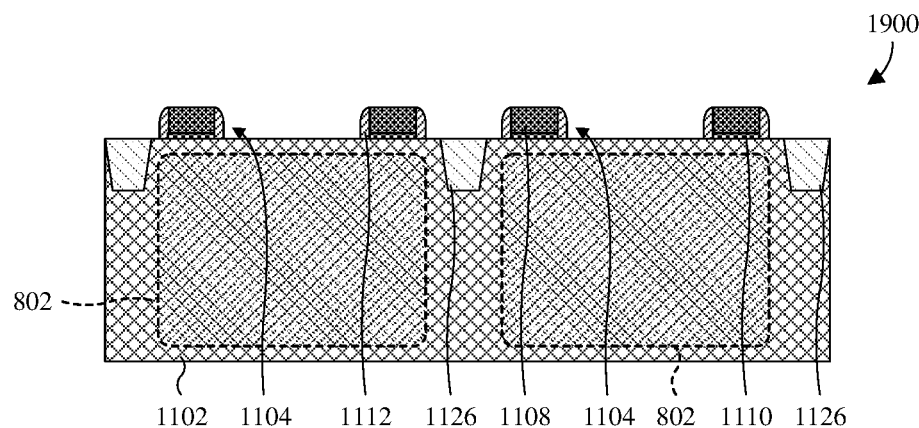
FIGS. 19, 20, 21A, and 21B illustrate a series of cross-sectional views of various embodiments of a method for forming a frontside illuminated (FSI) integrated image chip comprising a narrow band filter with high transmission.
Figure 20:
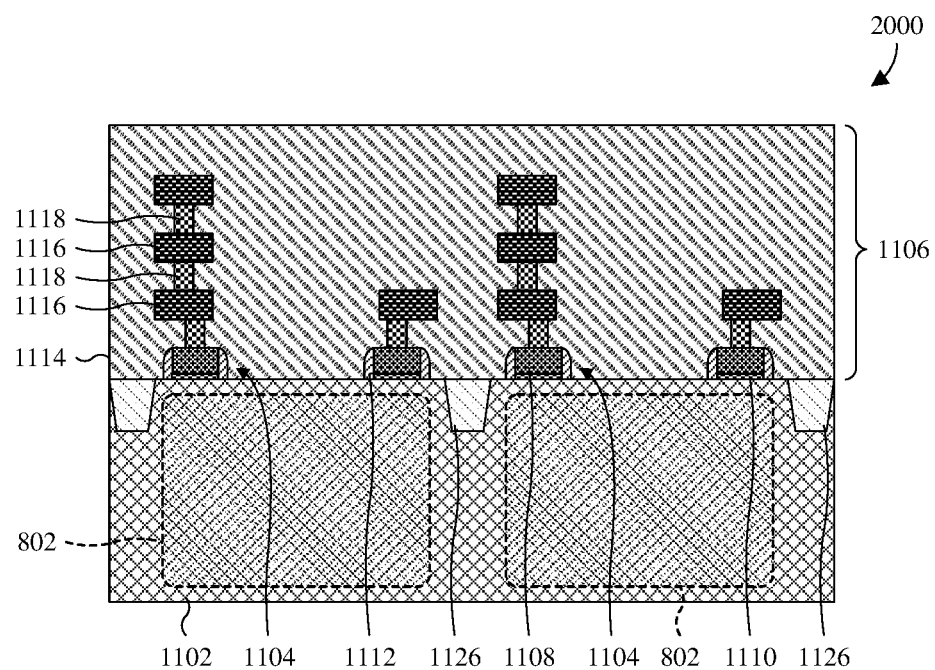
Figure 21A:
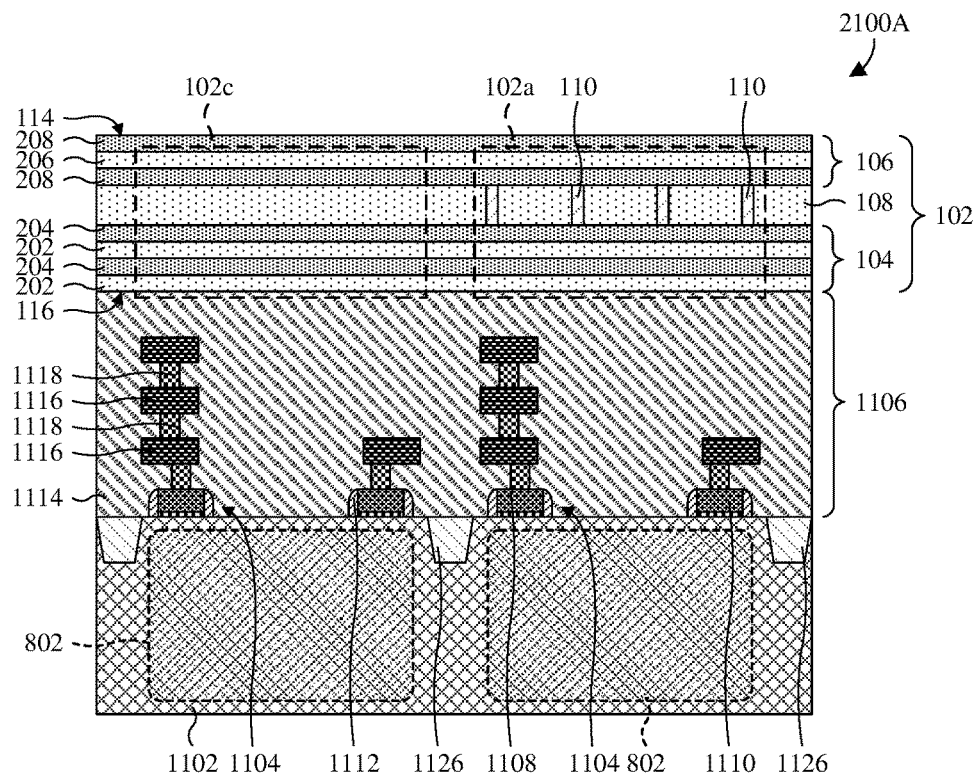
Figure 21B:
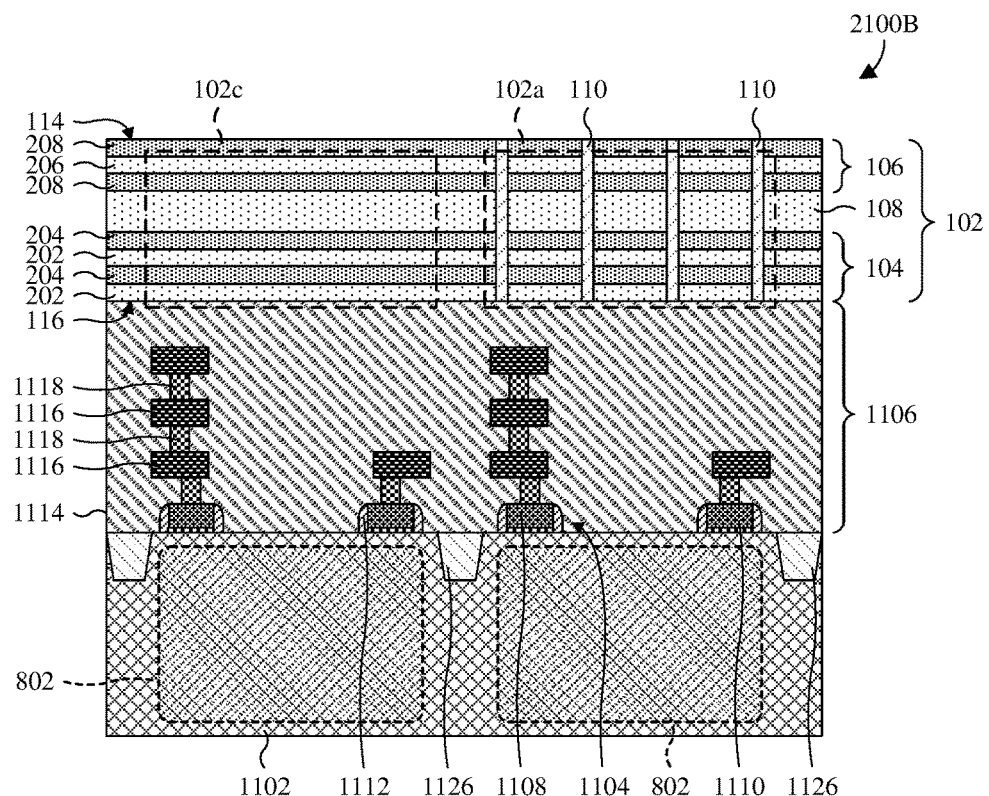

With reference to FIGS. 19, 20, 21A, and 21B, a series of cross-sectional views 1900, 2000, 2100A, and 2100B of various embodiments of a method for forming an FSI integrated image chip comprising a narrow band filter with high transmission is provided. FIG. 21B is an alternative to FIG. 21A. As such, the method proceeds from FIGS. 19 and 20 to FIG. 21A in first embodiments, and proceeds from FIGS. 19 and 20 to FIG. 21B in second embodiments. The first embodiments may, for example, be performed to form embodiments of the narrow band filter in FIGS. 2A-2E. The second embodiments may, for example, be performed to form embodiments of the narrow band filter in FIGS. 3A-3E. While FIGS. 19, 20, 21A, and 21B are described with reference to a method, it will be appreciated that the structures shown in FIGS. 19, 20, 21A, and 21B are not limited to the method and may stand alone.

As illustrated by the cross-sectional view 1900 of FIG. 19, photodetectors 802 are formed in a semiconductor substrate 1102, and isolation structures 1126 are formed extending into a frontside of the semiconductor substrate 1102 and separating the photodetectors 802. Further, semiconductor devices 1104 are formed on the frontside of the semiconductor substrate 1102. The photodetectors 802, the semiconductor substrate 1102, the semiconductor devices 1104, the isolation structures 1126, or any combination of the foregoing may, for example, be as described with regard to FIGS. 11A-11D.

As illustrated by the cross-sectional view 2000 of FIG. 20, an interconnect structure 1106 is formed covering the photodetectors 802, the semiconductor substrate 1102, the semiconductor devices 1104, and the isolation structures 1126 on the frontside of the semiconductor substrate 1102. The interconnect structure 1106 may, for example, be as described with regard to FIGS. 11A-11D and/or may, for example, be performed by a series of single and/or dual damascene processes.

As illustrated by the cross-sectional view 2100A of FIG. 21A, a narrow band filter 102 is formed covering the interconnect structure 1106 on the frontside of the semiconductor substrate 1102. The narrow band filter 102 comprises a first multilayer film 104, a defect layer 108, columnar structures 110, and a second multilayer film 106. The defect layer 108 is on the first multilayer film 104, and the second multilayer film 106 is on the defect layer 108. Further, the columnar structures 110 extend through the defect layer 108 and are confined to the defect layer 108. The narrow band filter 102 may, for example, be as described, and/or formed as described, with regard to FIGS. 16A-16D.

The foregoing embodiments of the method proceeded from FIGS. 19 and 20 to FIG. 21A. However, in alternative embodiments, the acts at FIG. 21B are performed in place of the acts at FIG. 21A, whereby the method proceeds from FIGS. 19 and 20 to FIG. 21B.

As illustrated by the cross-sectional view 2100B of FIG. 21B, the columnar structures 110 are formed extending through the defect layer 108 and the first and second multilayer films 104, 106, instead of just the defect layer 108. The narrow band filter 102 may, for example, be as described, and/or formed as described, with regard to FIGS. 17A-17C.

Figure 22:
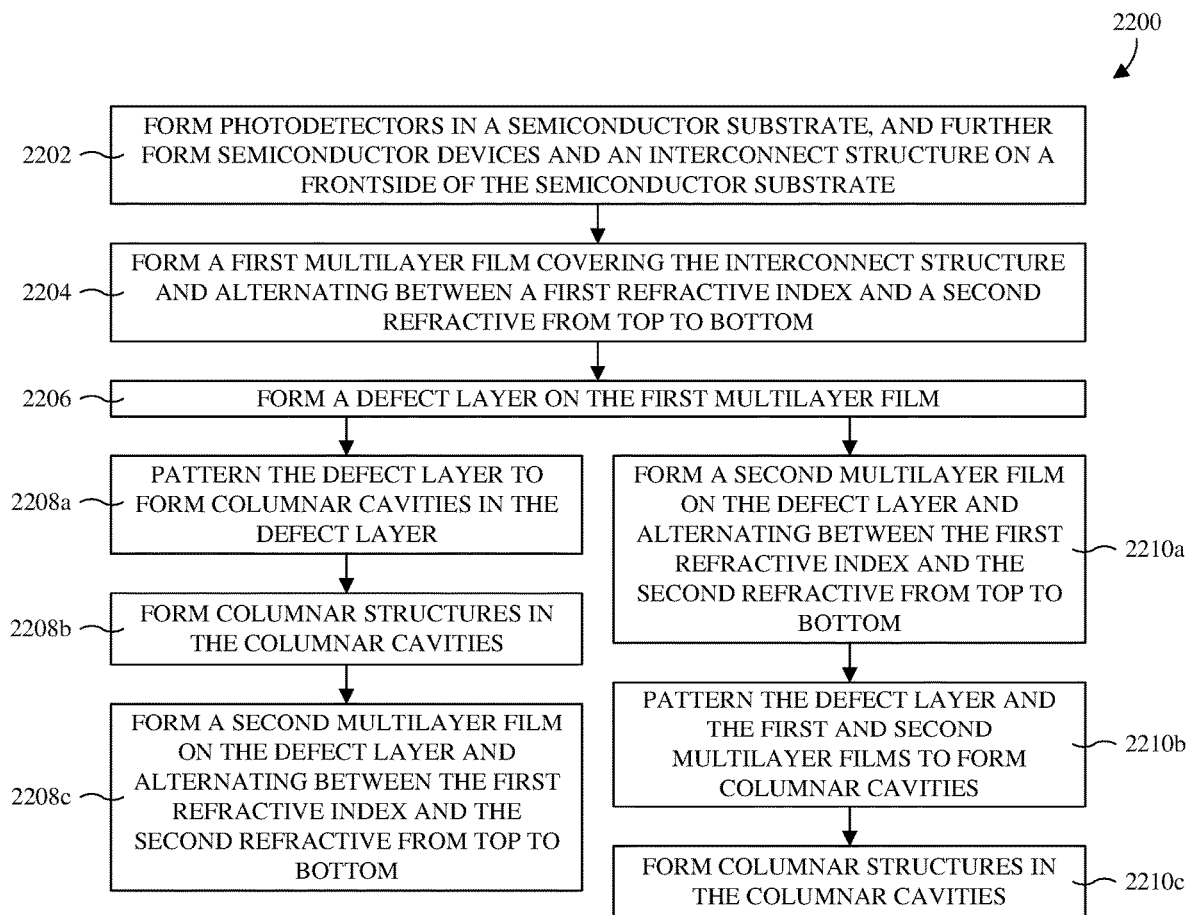
FIG. 22 illustrates a block diagram of some embodiments of the method of FIGS. 19, 20, 21A, and 21B.

With reference to FIG. 22, a block diagram 2200 of some embodiments of the method of FIGS. 19, 20, 21A, and 22B is provided.

At 2202, photodetectors are formed in the semiconductor substrate. Further, semiconductor devices and an interconnect structure are formed on a frontside of the semiconductor substrate. See, for example, FIGS. 19 and 20.

At 2204, a first multilayer film is formed on the interconnect structure and alternating between a first refractive index and a second refractive from top to bottom. See, for example, FIG. 21A or FIG. 21B.

At 2206, a defect layer is formed on the first multilayer film. See, for example, FIG. 21A or FIG. 21B.

In some first embodiments of the method, the method proceeds from 2206 to 2208a-2208c. At 2208a, the defect layer is patterned to form columnar cavities in the defect layer. See, for example, FIG. 21A. At 2208b, columnar structures are formed in the columnar cavities. See, for example, FIG. 21A. At 2208c, a second multilayer film is formed on the defect layer and alternating between the first refractive index and the second refractive from top to bottom. See, for example, FIG. 21A.

In some second embodiments of the method, the method proceeds from 2206 to 2210a-2210c. At 2210a, a second multilayer film is formed on the defect layer and alternating between the first refractive index and the second refractive from top to bottom. See, for example, FIG. 21B. At 2210b, the defect layer and the first and second multilayer films are patterned to form columnar cavities. See, for example, FIG. 21B. At 2210c, columnar structures are formed in the columnar cavities. See, for example, FIG. 21B.

While the block diagram 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an image sensor including: a substrate; a photodetector in the substrate; and a filter overlying the photodetector and including: a first DBR; a second DBR; a defect layer between the first and second DBRs; and a plurality of columnar structures extending through the defect layer, wherein the columnar structures are in a periodic pattern and have a refractive index different than a refractive index of the defect layer. In some embodiments, top surfaces of the columnar structures are even with a top surface of the defect layer, and wherein bottom surfaces of the column structures are even with a bottom surface of the defect layer. In some embodiments, the columnar structures extend through the first and second DBRs and the defect layer. In some embodiments, the first or second DBR includes a plurality of first layers and a plurality of second layers, wherein the second layers are alternatingly stacked with the first layers, and wherein the defect layer has a refractive index different than refractive indexes respectively of the first and second layers. In some embodiments, the first and second DBRs each include a plurality of first layers and a plurality of second layers, wherein the second layers are alternatingly stacked with the first layers, wherein the defect layer and the first layers have the same refractive index, wherein the defect layer directly contacts one of the second layers from the first DBR and one of the second layers from the second DBR, and wherein the defect layer has a different thickness than an individual one of the first layers. In some embodiments, the columnar structures include a columnar structure with a top layout that is circular or square shaped. In some embodiments, the columnar structures are arranged in a plurality of rows and a plurality of columns. In some embodiments, the columnar structures are arranged in quincunx patterns. In some embodiments, the image sensor father includes an absorptive color filter overlying the first and second DBRs. In some embodiments, the image sensor further includes a low or high pass filter overlying the first and second DBRs.

In some embodiments, the present application provides a method for forming an image sensor, the method including: forming a photodetector in a substrate; depositing a first multilayer film on the substrate, wherein the first multilayer film includes a plurality of first layers and a plurality of second layers, wherein the first layers are alternatingly stacked with the second layers and share a first refractive index that is different than a second refractive index shared by the second layers; depositing a defect layer on the first multilayer film; and performing an etch into the defect layer to form a plurality of columnar cavities, wherein the columnar cavities are in a periodic pattern. In some embodiments, the method further includes forming a plurality of columnar structures in the columnar cavities, wherein the columnar structures are formed with a refractive index different than a refractive index of the defect layer. In some embodiments, the refractive index of the defect layer is different than the first and second refractive indexes, and wherein the first and second refractive indexes are between the refractive index of the columnar structures and the refractive index of the defect layer. In some embodiments, the defect layer includes the same material and the same refractive index as the first layers, directly contacts an individual one of the second layers, and has a different thickness than thicknesses respectively of the first layers. In some embodiments, the method further includes forming a BEOL interconnect structure overlying the photodetector and the substrate, wherein the first multilayer film is deposited over the BEOL interconnect structure. In some embodiments, the method further includes forming a BEOL interconnect structure on a first side of the substrate, where the first multilayer film is deposited on a second side of the substrate, wherein the first and second sides are opposite. In some embodiments, the method further includes depositing a second multilayer film on the defect layer, wherein the second multilayer film includes a plurality of third layers and a plurality of fourth layers, wherein the third layers are alternatingly stacked with the fourth layers and share the first refractive index, and wherein the fourth layers share the second refractive index. In some embodiments, the method further includes performing an etch into the first and second multilayer films to form the plurality of columnar cavities.

In some embodiments, the present application provides an integrated chip including: a substrate; a plurality of photodetectors in the substrate, wherein the plurality of photodetectors includes a first photodetector and a second photodetector; a pair of multilayer films each including a plurality of first layers and a plurality of second layers, wherein the first layers are alternatingly stacked with the second layers and have a different refractive index than the second layers; a defect layer between the multilayer films, wherein the defect layer has a different thickness or a different refractive index than the first and second layers; a first set of columnar structures overlying the first photodetector and extending through the defect layer; and a second set of columnar structures overlying the second photodetector and extending through the defect layer, wherein the columnar structures of the second set have a different fill factor than the columnar structures of the first set. In some embodiments, the present application provides the first and second sets of columnar structures extend through the multilayer films and the defect layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   an optical filter comprising:
     a first distributed Bragg reflector (DBR) alternating between a first refractive material type and a second refractive material type from a bottom surface of the first DBR to a top surface of the first DBR;
     a second DBR over the first DBR;
     an interlayer between the first and second DBRs; and
     a plurality of columnar structures extending through the interlayer,
     wherein the columnar structures are in a first periodic pattern and have a refractive index different than a refractive index of the interlayer; and
     an isolation layer under the first DBR, wherein the isolation layer is a different type of material than the first and second refractive material types;
     wherein the columnar structures further extend through the first DBR to direct contact with the isolation layer.

2. The image sensor according to claim 1, further comprising:
   a plurality of first layers and a plurality of second layers alternatingly stacked in a second periodic pattern from a bottom of the optical filter to the interlayer and from the interlayer to a top of the optical filter, wherein the first and second layers below the interlayer define the first DBR, wherein the first and second layers above the interlayer define the second DBR, wherein the first layers are the first refractive material type, and wherein the second layers are the second refractive material type.

3. The image sensor according to claim 2, wherein the interlayer has a different material than the first and second layers.

4. The image sensor according to claim 2, wherein the interlayer contacts two of the first layers that are respectively at the first and second DBRs, and wherein the interlayer has a same material as the second layers and a different thickness than the second layers.

5. The image sensor according to claim 1, further comprising a photodetector underlying the optical filter.

6. An integrated chip comprising:
   a substrate;
   a photodetector in the substrate;
   a pair of multilayer films overlying the photodetector, wherein each of the multilayer films comprises a plurality of first filter layers and a plurality of second filter layers, wherein the first filter layers are alternatingly and vertically stacked with the second filter layers and have a different material than the second filter layers; and
   an interlayer structure between the multilayer films, wherein the interlayer structure comprises a first refractive material and a second refractive material that alternate laterally in a first periodic pattern across the photodetector;
   wherein the pair of multilayer films comprises a bottom multilayer film and a top multilayer film respectively underlying and overlying the interlayer structure, wherein the interlayer structure is between and directly contacts one of the first filter layers of the bottom multilayer film and one of the first filter layers of the top multilayer film, and wherein the one of the first filter layers of the bottom multilayer film and the one of the first filter layers of the top multilayer film are a same type of material that is a different type of material than the first and second refractive materials.

7. The integrated chip according to claim 6, wherein the interlayer structure comprises a plurality of columnar structures that have the first refractive material.

8. The integrated chip according to claim 7, wherein the columnar structures extend through the multilayer films.

9. The integrated chip according to claim 6, wherein the interlayer structure has the first periodic pattern at both a top of the interlayer structure and a bottom of the interlayer structure.

10. The integrated chip according to claim 6, wherein the first and second refractive materials alternate laterally in a second periodic pattern across the photodetector, wherein the first periodic pattern and the second periodic pattern are different and respectively at a top of the interlayer structure and a bottom of the interlayer structure.

11. The integrated chip according to claim 6, wherein the interlayer structure comprises a first interlayer of the first refractive material and a second interlayer of the second refractive material, and wherein the first interlayer is localized between the multilayer films.

12. The integrated chip according to claim 11, wherein the second interlayer defines columnar structures embedded in the first interlayer and localized between the multilayer films.

13. The integrated chip according to claim 6, wherein the second filter layers of the multilayer films have the second refractive material and a different thickness than the interlayer structure.

14. An image sensor comprising a photodetector and an optical filter overlying the photodetector, wherein the optical filter comprises:

a stack of refractive layers, wherein the refractive layers alternate in a first periodic pattern between refractive indexes, and alternate in a second periodic pattern between thicknesses, from a topmost surface of the optical filter to a bottommost surface of the optical filter;

a defect layer spaced from, and at a midpoint between, the topmost surface of the optical filter and the bottommost surface of the optical filter, wherein the defect layer breaks the first periodic pattern and/or the second periodic pattern; and a plurality of columnar regions in a third periodic pattern in the defect layer and extending through the defect layer, wherein the columnar regions have different refractive indexes than the defect layer and have individual total widths that increase or decrease from a top of the defect layer to a bottom of the defect layer.

15. The image sensor according claim 14, wherein the stack defines a first band of wavelengths at which the optical filter transmits less than a first percentage of radiation, wherein the defect layer defines a second band of wavelengths bisecting the first band and at which the optical filter transmits more than a second percentage of radiation, and wherein the second percentage is higher than the first percentage.

16. The image sensor according to claim 15, wherein the first percentage is about 20%, and wherein the second percentage is about 80%.

17. The image sensor according to claim 14, wherein the defect layer breaks the second periodic pattern, but not the first periodic pattern.

18. The image sensor according to claim 14, wherein the defect layer defines the columnar regions as air-filled cavities that directly overlie the photodetector.

19. The image sensor according to claim 14, wherein the columnar regions extend through the stack from the topmost surface of the optical filter to the bottommost surface of the optical filter.

20. The image sensor according to claim 14, further comprising:

a color filter independent of and vertically stacked with the optical filter, wherein the color filter and the optical filter overlie the photodetector.

* * * * *